US012757711B2

(12) United States Patent
Lee et al.

(10) Patent No.: US 12,757,711 B2
(45) Date of Patent: Oct. 6, 2026

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Ah Reum Lee, Suwon-si (KR); Woo Sung Yang, Suwon-si (KR); Ji Mo Gu, Suwon-si (KR); Jae Ho Kim, Suwon-si (KR); Suk Kang Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 18/197,768

(22) Filed: May 16, 2023

(65) Prior Publication Data

US 2024/0071907 A1 Feb. 29, 2024

(30) Foreign Application Priority Data

Aug. 24, 2022 (KR) ........................ 10-2022-0105867

(51) Int. Cl.
*H10W 20/42* (2026.01)
*H10B 43/27* (2023.01)
(Continued)

(52) U.S. Cl.
CPC ............ *H10W 20/42* (2026.01); *H10B 43/27* (2023.02); *H10B 43/35* (2023.02); *H10W 20/20* (2026.01); *H10W 20/43* (2026.01)

(58) Field of Classification Search
CPC ........ H10B 43/27; H10B 43/35; H10B 43/40; H10B 43/50; H10B 43/20; H10B 43/10;
(Continued)

(56) References Cited

U.S. PATENT DOCUMENTS 9,634,023 B2 4/2017 Lee
9,653,562 B2 5/2017 Kim et al.
(Continued)

FOREIGN PATENT DOCUMENTS

CN 112670296 4/2021
CN 112786606 5/2021
(Continued)

OTHER PUBLICATIONS

Office Action dated Jan. 21, 2026 issued in the corresponding Korean Patent Application No. 10-2022-0105867. (Note: US2022/0069093A already submitted.).

*Primary Examiner* — Galina G Yushina
(74) *Attorney, Agent, or Firm* — MORGAN, LEWIS & BOCKIUS LLP

(57) ABSTRACT

A semiconductor device includes first and second substrates connected to each other. The second substrate includes a plate layer having first and second faces. Gate electrode layers are disposed on the first face of the plate layer. Channel structures extend through the gate electrode layers. Word-line cutting structures extend through the gate electrode layers and are spaced apart from each other. Via structures are disposed on the second face of the plate layer. Via connecting structures are disposed on the top face of the via structures. A width of the bottom face of each of the via structures is greater than a width of the top face of each of the via structures. A width of the bottom face of each of the via connecting structures is less than a width of the top face of each of the via connecting structures.

16 Claims, 32 Drawing Sheets

(51) Int. Cl.
*H10B 43/35* (2023.01)
*H10W 20/20* (2026.01)
*H10W 20/43* (2026.01)

(58) Field of Classification Search
CPC .. H01L 23/5226; H01L 23/528; H10W 20/42; H10W 20/20; H10W 20/43
See application file for complete search history.

(56) References Cited

U.S. PATENT DOCUMENTS

| | | | | |
|---|---|---|---|---|
| 10,522,460 | B2 | 12/2019 | Ichinose et al. | |
| 10,879,196 | B2 | 12/2020 | Hong et al. | |
| 2019/0057898 | A1* | 2/2019 | Shim | H10B 43/10 |
| 2020/0402923 | A1* | 12/2020 | Shim | H10B 43/40 |
| 2021/0066313 | A1* | 3/2021 | Park | H10B 20/40 |
| 2021/0143096 | A1* | 5/2021 | Yun | H01L 25/18 |
| 2021/0151456 | A1 | 5/2021 | Kim | |
| 2021/0375806 | A1* | 12/2021 | Zhang | H01L 24/08 |
| 2022/0069093 | A1* | 3/2022 | Tagami | H10B 43/27 |
| 2022/0077129 | A1 | 3/2022 | Sung et al. | |
| 2022/0115294 | A1* | 4/2022 | Kim | H01L 25/105 |

FOREIGN PATENT DOCUMENTS

| | | |
|---|---|---|
| KR | 10-2022-0018343 | 2/2022 |
| KR | 10-2022-0034273 A | 3/2022 |

* cited by examiner

SEMICONDUCTOR DEVICE AND ELECTRONIC SYSTEM INCLUDING THE SAME

CROSS-REFERENCE TO RELATED APPLICATION

This application claims priority under 35 U.S.C. § 119 to Korean Patent Application No. 10-2022-0105867, filed on Aug. 24, 2022 in the Korean Intellectual Property Office, the disclosure of which is incorporated by reference in its entirety herein.

TECHNICAL FIELD

The present disclosure relates to a semiconductor device and an electronic system including the same.

DISCUSSION OF RELATED ART

As consumer demand has increased for semiconductor devices storing a high capacity of data in an electronic system, research is being conducted for increasing a data storage capacity of the semiconductor device. A semiconductor device including memory cells arranged in a three-dimensional manner instead of memory cells arranged in a two-dimensional manner has been proposed to increase the data storage capacity of the semiconductor device.

SUMMARY

A technical purpose of embodiments of the present disclosure is to provide a semiconductor device with increased product reliability.

Another technical purpose of embodiments of the present disclosure is to provide an electronic system including a semiconductor device with increased product reliability.

Purposes according to embodiments of the present disclosure are not limited to the above-mentioned purposes. Other purposes and advantages according to the present disclosure that are not mentioned may be understood based on following descriptions, and may be more clearly understood based on embodiments according to the present disclosure.

According to an embodiment of the present disclosure, a semiconductor device includes a first substrate structure including a first substrate, circuit elements disposed on the first substrate, and first bonding metal layers disposed on the circuit elements. A second substrate structure is disposed on the first substrate structure. The second substrate structure is connected to the first substrate structure. The second substrate structure includes a plate layer including a conductive material. The plate layer has first and second faces opposite to each other. Gate electrode layers are disposed on the first face of the plate layer. The gate electrode layers are stacked on top of each other in a first direction perpendicular to the first face of the plate layer and are spaced apart from each other in the first direction. Channel structures extend through the gate electrode layers in the first direction. Word-line cutting structures extend through the gate electrode layers. The word-line cutting structures extend in each of the first direction and a second direction intersecting the first direction and parallel to the first face of the plate layer. The word-line cutting structures are spaced apart from each other along a third direction intersecting each of the first and second directions and parallel to the first face of the plate layer. Via structures are disposed on the second face of the plate layer. The via structures extend in the third direction. The via structures are spaced apart from each other along the second direction. Each of the via structures includes a bottom face facing the second face of the plate layer and a top face opposite the bottom face. Via connecting structures are disposed on the top face of the via structures. The via connecting structures extend in the second direction. The via connecting structures are spaced apart from each other along the third direction. Each of the via connecting structures includes a bottom face facing the top face of the via structures and a top face opposite the bottom face. Second bonding metal layers are disposed under the channel structures and the gate electrode layers and are connected to the first bonding metal layers. A width of the bottom face of each of the via structures is greater than a width of the top face of each of the via structures. A width of the bottom face of each of the via connecting structures is less than a width of the top face of each of the via connecting structures.

According to an embodiment of the present disclosure, a semiconductor device includes a first substrate structure including a first substrate, circuit elements disposed on the first substrate, and first bonding metal layers disposed on the circuit elements. A second substrate structure is disposed on the first substrate structure. The second substrate structure is connected to the first substrate structure. The second substrate structure includes a plate layer including a conductive material. Gate electrode layers are disposed on a bottom face of the plate layer. The gate electrode layers are stacked on top of each other and are spaced apart from each other along a vertical direction perpendicular to the bottom face of the plate layer. Channel structures extend through the gate electrode layers in the vertical direction. Each of the channel structures includes a channel layer. Word-line cutting structures extend through the gate electrode layers and extend in a first direction parallel to the bottom face of the plate layer. Via structures are disposed on the plate layer and extend in a second direction intersecting the first direction. The via structures are spaced apart from each other along the first direction. Via connecting structures are disposed on a top surface of the via structures. The via connecting structures extend in the first direction. The via connecting structures are spaced apart from each other along the second direction. Second bonding metal layers are disposed under the channel structures and the gate electrode layers and are connected to the first bonding metal layers. In a plan view of the semiconductor device, the second substrate structure includes a first area including the channel structures, and a second area around the first area. Each of the via structures includes a first extension disposed in the first area and extending in the second direction. A first spaced portion is disposed in the second area and is spaced apart from the first extension in each of the first and second directions. Each of the via connecting structures includes a second extension disposed in the first area and extending in the first direction. A second spaced portion is disposed in the second area and is spaced apart from the second extension in each of the first and second directions.

According an embodiment of the present disclosure, an electronic system includes a main substrate. A semiconductor device is disposed on the main substrate. The semiconductor device includes a peripheral circuit structure including first bonding metal layers, and a cell structure including second bonding metal layers connected to the first bonding metal layers. A controller is disposed on the main substrate, and is electrically connected to the semiconductor device. In a plan view of the electronic system, the cell structure includes a first area and a second area disposed around the first area. The cell structure includes a source plate layer disposed in the first area. Gate electrode layers are disposed on a bottom face of the source plate layer. The gate electrode layers are stacked on top of each other and spaced apart from each other along a vertical direction perpendicular to the bottom face of the source plate layer. Channel structures are disposed in the first area and extend through the gate electrode layers in the vertical direction. Word-line cutting structures extend through the gate electrode layers and extend in a first direction parallel to the bottom face of the source plate layer. Cell contact structures are disposed in the first area. Each of the cell contact structures is electrically connected to one of the gate electrode layers. Dummy channel structures are disposed in the first area. The dummy channel structures are electrically isolated from the gate electrode layers. Source contact structures are disposed in the first area. The source contact structures do not extend through the gate electrode layers and extend through at least a portion of the plate layer. Through structures are disposed in the second area. The through structures are electrically connected to the peripheral circuit structure. The through structures are not disposed on the plate layer. Bypass vias are disposed on the source plate layer and extend in a second direction parallel to the bottom face of the source plate layer and intersecting the first direction. The bypass vias are spaced apart from each other along the first direction. Via connecting patterns are disposed on the bypass vias. The via connecting patterns extend in the first direction. The via connecting patterns are spaced apart from each other along the second direction. A width of each of the bypass vias increases as each of the bypass vias extends towards the source plate layer. A width of each of the via connecting patterns decreases as each of the via connecting patterns extends towards the source plate layer.

The specific details of other embodiments are included in the detailed description and drawings.

BRIEF DESCRIPTION OF DRAWINGS

The above and other aspects and features of the present disclosure will become more apparent by describing in detail embodiments thereof with reference to the attached drawings, in which.

DETAILED DESCRIPTIONS OF EMBODIMENTS

Figure 1:
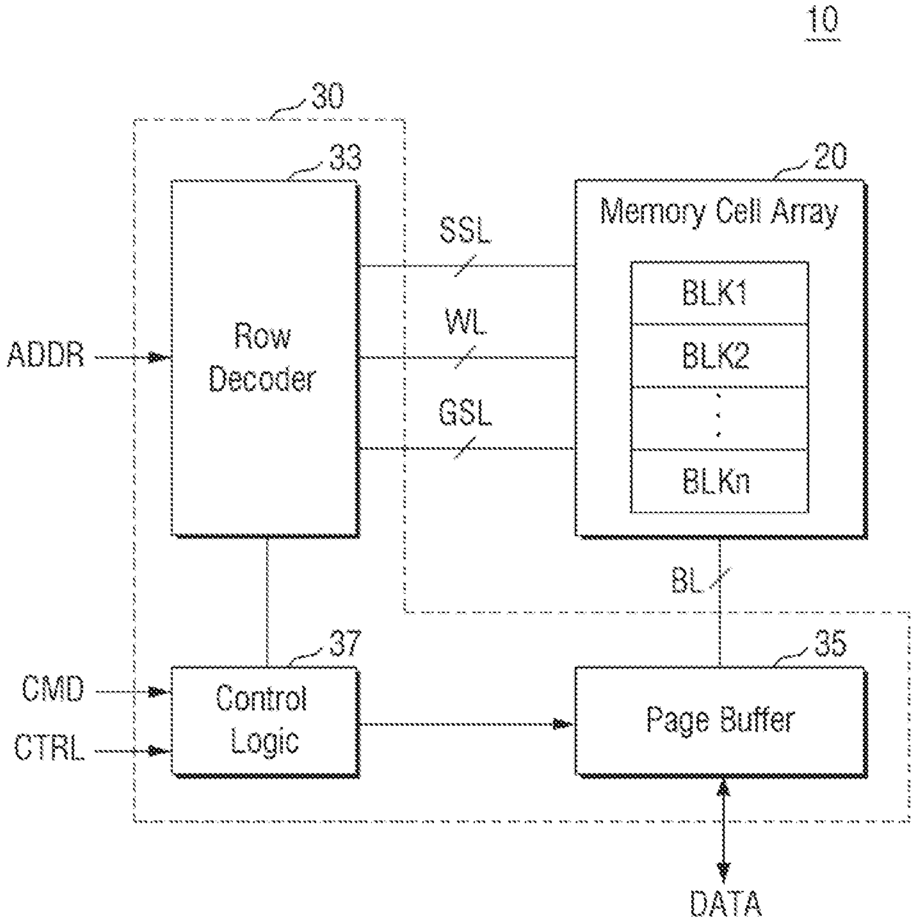
FIG. 1 is an illustrative block diagram for illustrating a semiconductor device according to some embodiments.

For simplicity and clarity of illustration, elements in the drawings are not necessarily drawn to scale. The same reference numbers in different drawings represent the same or similar elements, and as such perform similar functionality. Further, descriptions and details of well-known steps and elements may be omitted for simplicity of the description. Furthermore, in the following detailed description of the present disclosure, numerous specific details of embodiments are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of embodiments of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure.

A shape, a size, a ratio, an angle, a number, etc. disclosed in the drawings for illustrating embodiments of the present disclosure may be exaggerated or simplified for convenience of description, and embodiments of the present disclosure are not necessarily limited thereto. The same reference numerals refer to the same elements herein.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between and connected to the first and second elements or layers. It will be understood that when an element or layer is referred to as being "connected to", or "coupled to" another element or layer, it may be directly on, connected to, or coupled to the other element or layer, or one or more intervening elements or layers may be present. When an element or layer is referred to as being "directly connected to", or "directly coupled to" another element or layer, no intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between and connected to the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between and connected to the former and the latter. Further, as used herein, when a layer, film, region, plate, or the like may be disposed "below" or "under" another layer, film, region, plate, or the like, the former may directly contact the latter or still another layer, film, region, plate, or the like may be disposed between and connected to the former and the latter. As used herein, when a layer, film, region, plate, or the like is directly disposed "below" or "under" another layer, film, region, plate, or the like, the former directly contacts the latter and still another layer, film, region, plate, or the like is not disposed between and connected to the former and the latter.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation for illustrating one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction Y", "second direction X" and "third direction Z" should not be interpreted only to have a geometric relationship in which the first direction, the second direction, and the third direction are perpendicular to each other. The "first direction Y", "second direction X" and "third direction Z" may be interpreted to have a broader direction within a range in which components herein may work functionally.

Hereinafter, embodiments of the present disclosure will be described in detail with reference to the accompanying drawings. The same reference numerals are used for the same components in the drawings, and duplicate descriptions thereof may be omitted for economy of description.

FIG. 1 is an illustrative block diagram for illustrating a semiconductor device according to some embodiments.

Referring to FIG. 1, a semiconductor device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 via a bit-line BL, word-lines WL11 to WL1*n*, and WL21 to WL2*n*, at least one string select line SSL, and at least one ground select line GSL. In an embodiment, the memory cell blocks BLK1 to BLKn may be connected to a row decoder 33 via the word-lines WL11 to WL1*n*, and WL21 to WL2*n*, the string select line SSL and the ground select line GSL. Further, the memory cell blocks BLK1 to BLKn may be connected to a page buffer 35 via the bit-line BL.

The peripheral circuit 30 may receive an address ADDR, a command CMD, and a control signal CTRL from an external device to the semiconductor device 10, and may transmit and receive data DATA to and from an external device to the semiconductor device 10. The peripheral circuit 30 may include a control logic 37, the row decoder 33, and the page buffer 35. In an embodiment, the peripheral circuit 30 may further include various sub-circuits such as an input/output circuit, a voltage generation circuit for generating various voltages required for an operation of the semiconductor device 10, and an error correction circuit for correcting an error of the data DATA read from the memory cell array 20.

The control logic 37 may be connected to the row decoder 33, the input/output circuit, and the voltage generation circuit. The control logic 37 may control overall operations of the semiconductor device 10. The control logic 37 may generate various internal control signals used in the semiconductor device 10 in response to the control signal CTRL. For example, the control logic 37 may adjust a voltage level of a voltage supplied to the word-lines WL11 to WL1*n*, and WL21 to WL2*n* and the bit-line BL when performing a memory operation such as a program operation or an erase operation.

The row decoder 33 may select at least one of the plurality of memory cell blocks BLK1 to BLKn in response to the address ADDR, and may select at least one word-line WL11 to WL1*n*, and WL21 to WL2*n*, at least one string select line SSL, and at least one ground select line GSL of the selected at least one memory cell block BLK1 to BLKn. Further, the row decoder 33 may transmit a voltage for performing a memory operation to the word-line WL11 to WL1*n*, and WL21 to WL2*n* of the selected at least one memory cell block BLK1 to BLKn.

The page buffer 35 may be connected to the memory cell array 20 via the bit-line BL. The page buffer 35 may operate as a writer driver or a sense amplifier. In an embodiment, when performing a program operation, the page buffer 35 operates as the writer driver to apply a voltage based on the data DATA to be stored in the memory cell array 20 to the bit-line BL. On the other hand, when performing a read operation, the page buffer 35 may operate as the sense amplifier to detect the data DATA stored in the memory cell array 20.

Figure 2:
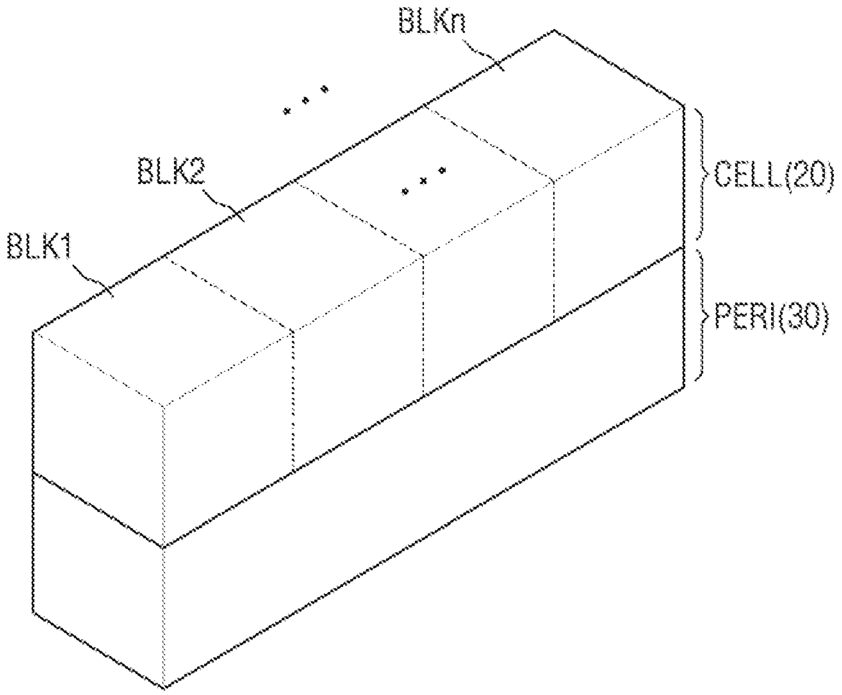
FIG. 2 is a perspective view briefly showing a semiconductor device according to some embodiments.

FIG. 2 is a perspective view briefly showing a semiconductor device according to some embodiments.

Referring to FIG. 2, the semiconductor device according to some embodiments may include a peripheral circuit structure PERI and a cell structure CELL.

The cell structure CELL may be stacked on the peripheral circuit structure PERI. For example, the peripheral circuit structure PERI and the cell structure CELL may overlap each other in a plan view. The semiconductor device according to some embodiments may have a COP (Cell Over Peri) structure.

For example, the cell structure CELL may include the memory cell array 20 of FIG. 1. The peripheral circuit structure PERI may include the peripheral circuit 30 of FIG. 1.

The cell structure CELL may include the plurality of memory cell blocks BLK1 to BLKn disposed on the peripheral circuit structure PERI.

Figure 3:
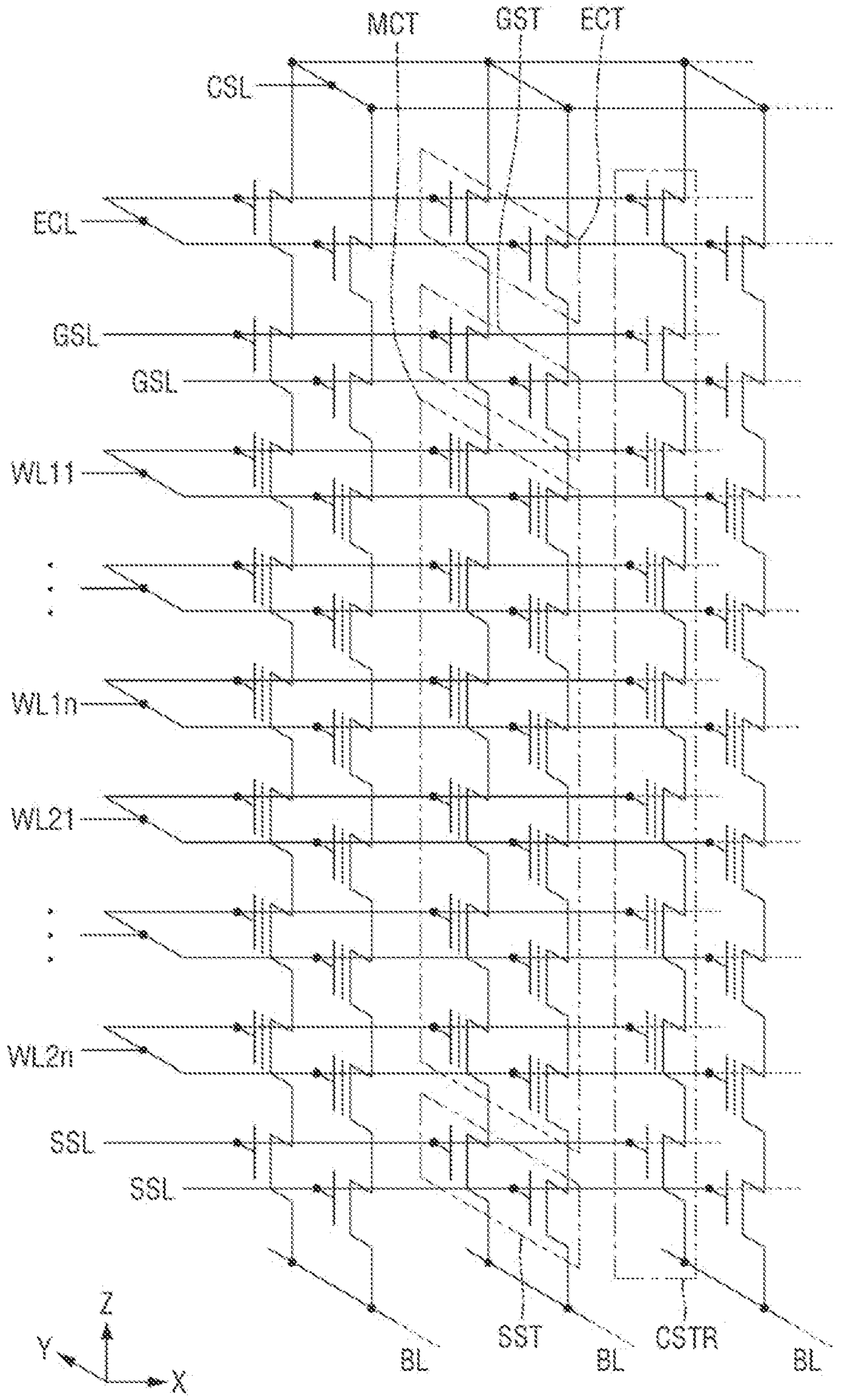
FIG. 3 is an illustrative circuit diagram for illustrating a semiconductor device according to some embodiments.

FIG. 3 is an illustrative circuit diagram for illustrating a semiconductor device according to some embodiments.

Referring to FIG. 3, the memory cell array (20 in FIG. 1) of the semiconductor device according to some embodiments includes a common source line CSL, a plurality of bit-lines BL, and a plurality of cell strings CSTR.

The common source line CSL may extend in a first direction X. In some embodiments, a plurality of common source lines CSL may be two-dimensionally arranged. For example, the plurality of common source lines CSL may be spaced apart from each other while extending in the first direction X. The same voltage may be electrically applied to the common source lines CSL. Alternatively, different voltages may be individually applied to be the common source lines CSL.

The plurality of bit-lines BL may be two-dimensionally arranged. For example, the bit-lines BL may be spaced apart from each other (e.g., in the first direction X) and extend in a second direction Y intersecting the first direction X. The plurality of cell strings CSTR may be connected in parallel to each of the bit-lines BL. The cell strings CSTR may be commonly connected to the common source line CSL. For example, the plurality of cell strings CSTR may be disposed between the bit-lines BL and the common source line CSL.

Each of the cell strings CSTR may include a ground select transistor GST connected to the common source line CSL, a string select transistor SST connected to the bit-line BL, and a plurality of memory cell transistors MCT disposed between the ground select transistor GST and the string select transistor SST. Each of the memory cell transistors MCT may include a data storage element. The ground select transistor GST, the string select transistor SST and the memory cell transistors MCT may be connected in series to each other in the third direction Z (e.g., a vertical direction). In an embodiment of the present disclosure, the first direction X, the second direction Y, and the third direction Z may be substantially perpendicular to each other. However, embodiments of the present disclosure are not necessarily limited thereto and the first to third directions X, Y, Z may cross each other at various different angles in some embodiments.

The common source line CSL may be commonly connected to sources of the ground select transistors GST. Further, a ground select line GSL, a plurality of word-lines WL11 to WL1*n*, and WL21 to WL2*n*, and a string select line SSL may be disposed between the common source line CSL and the bit-line BL. The ground select line GSL may act as a gate electrode of the ground select transistor GST. The word-lines WL11 to WL1*n*, and WL21 to WL2*n* may be respectively used as gate electrodes of the memory cell transistors MCT. The string select line SSL may act as a gate electrode of the string select transistor SST.

In some embodiments, an erase control transistor ECT may be disposed between the common source line CSL and the ground select transistor GST (e.g., in the third direction Z) and/or between the source select transistor SST and the bit-line BL (e.g., in the third direction Z). For example, the erase control transistor ECT may be connected to and disposed between the common source line CSL and the ground select transistor GST, while the common source line CSL may be commonly connected to sources of the erase control transistors ECT. Further, an erase control line ECL may be disposed between the common source line CSL and the ground select line GSL (e.g., in the third direction Z). The erase control line ECL may act as a gate electrode of the erase control transistor ECT. The erase control transistors ECT may generate gate induced drain leakage (GIDL) to execute an erase operation of the memory cell array.

Figure 4:
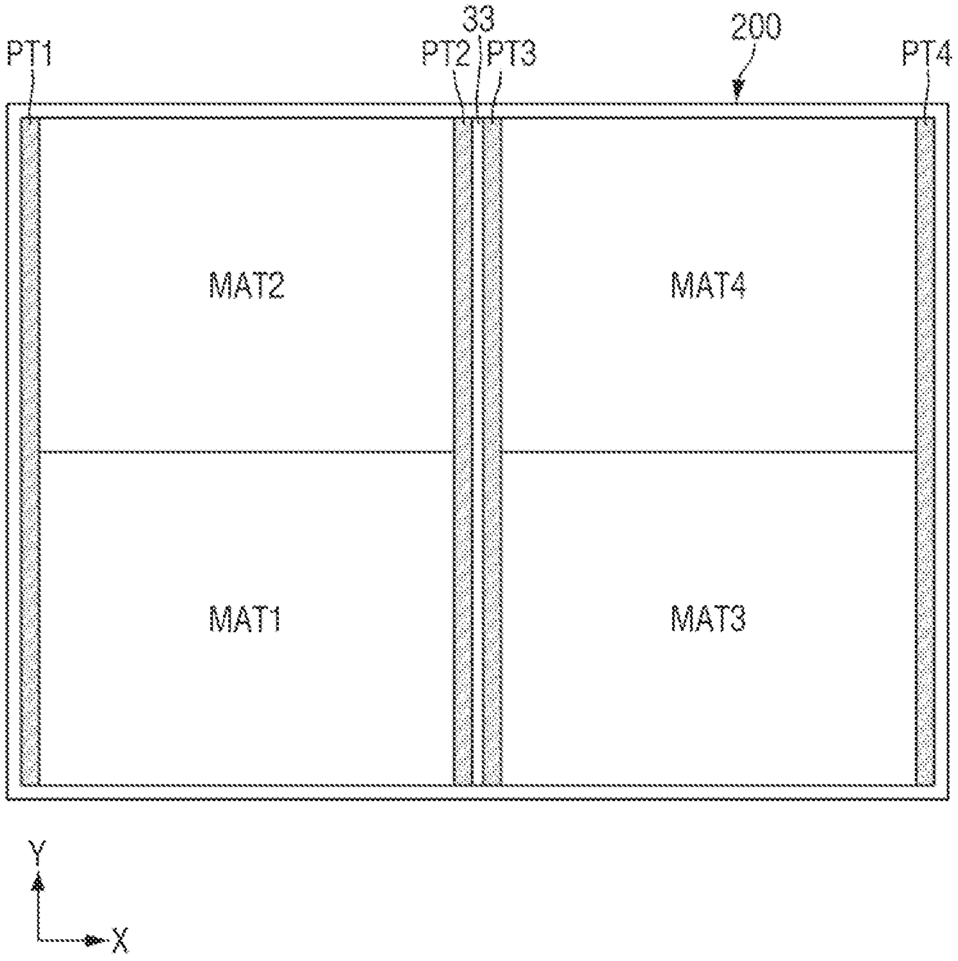
FIG. 4 is a schematic layout diagram for illustrating a mat according to some embodiments.

FIG. 4 is a schematic layout diagram for illustrating a mat according to some embodiments.

Referring to FIG. 4, the semiconductor device 10 according to some embodiments may include a plurality of mats MAT1 to MAT4 disposed in the peripheral circuit structure PERI. While an embodiment shown in FIG. 4 includes four mats for the plurality of mats MAT1 to MAT4, embodiments of the present disclosure are not necessarily limited thereto and the number of mats may vary.

The mats MAT1 to MAT4 may be arranged along each of the first direction X and the second direction Y while being disposed on a peripheral circuit substrate 200. Each of the mats MAT1 to MAT4 may include the plurality of memory blocks BLK0 to BLKn of FIG. 2.

In some embodiments, a pass transistor PT1 may be disposed on one side of a combination of the mats MAT1 to MAT4, and a pass transistor PT2 may be disposed on the other side of the combination of the mats MAT1 to MAT4. For example, as shown in FIG. 4, the pass transistor PT1 may be disposed on the left side of the combination of the mats MAT1 to MAT4 (e.g., in the X direction) and the pass transistor PT4 may be disposed on the right side of the combination of the mats MAT1 to MAT4 (e.g., in the X direction). The pass transistors PT2, PT3 may be disposed between the mats MAT1, MAT2 and MAT3, MAT4 (e.g., in the X direction). However, embodiments of the present disclosure are not necessarily limited thereto.

In some embodiments, the row decoder (33 of FIG. 1 and FIG. 4) may be disposed between the mats MAT1 and MAT3 spaced apart from each other in the first direction X and/or the mats MAT2 and MAT4 spaced apart from each other in the first direction X. The row decoder 33 may be connected to the word-lines (WL11 to WL1*n*, and WL21 to WL2*n* of FIG. 3), for example, via pass transistors PT1 to PT4. When the pass transistors PT1 to PT4 are turned on, the row decoder 33 may input a word-line voltage to the word-lines (WL11 to WL1*n*, and WL21 to WL2*n* of FIG. 3).

Figure 5:
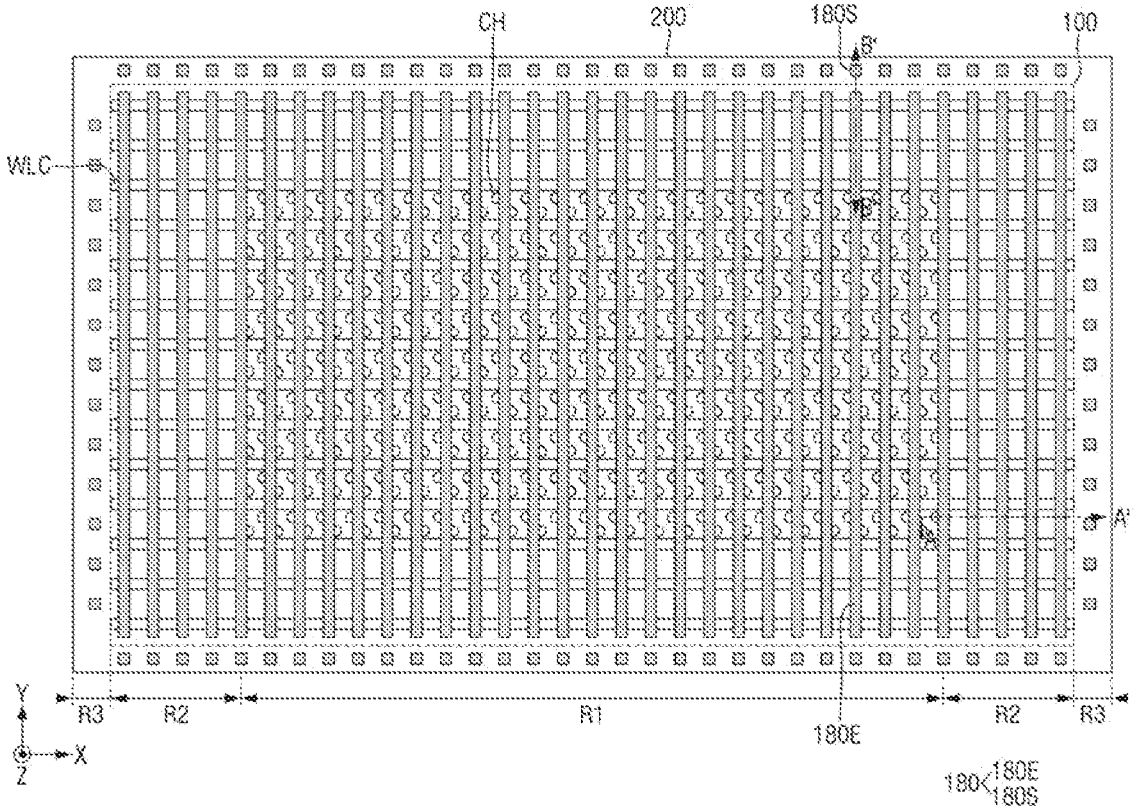
FIGS. 5 to 6 are schematic layout diagrams for illustrating a positional relationship between a via structure and a via connecting structure according to some embodiments.
Figure 6:
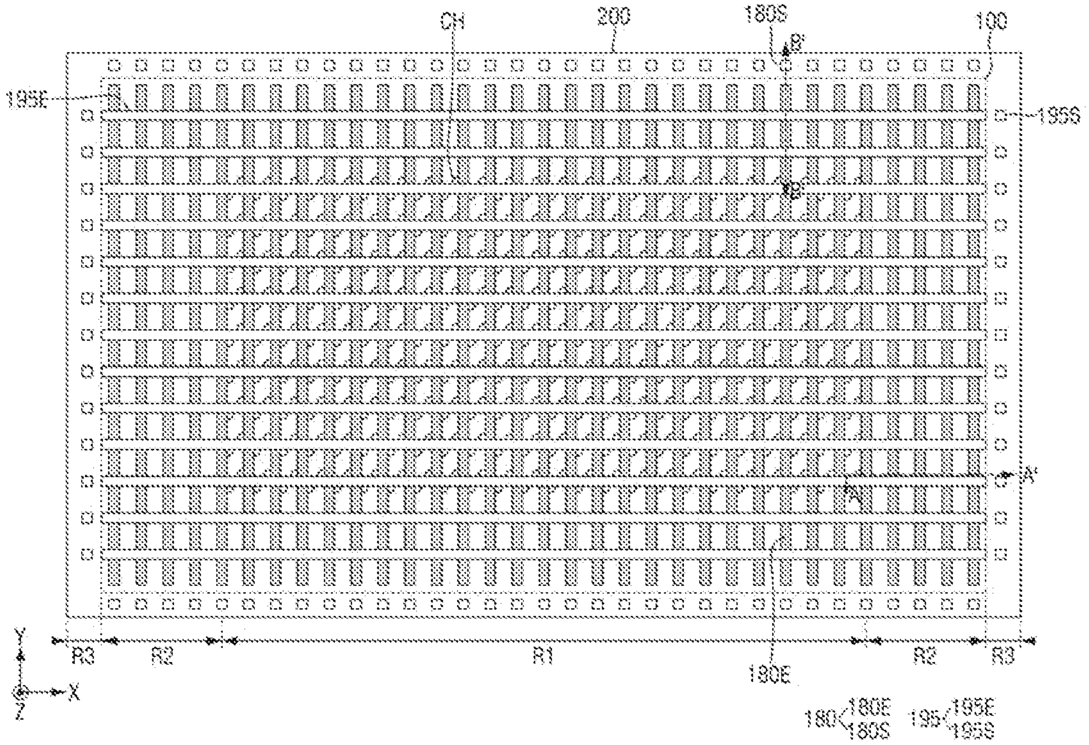
Figure 7:
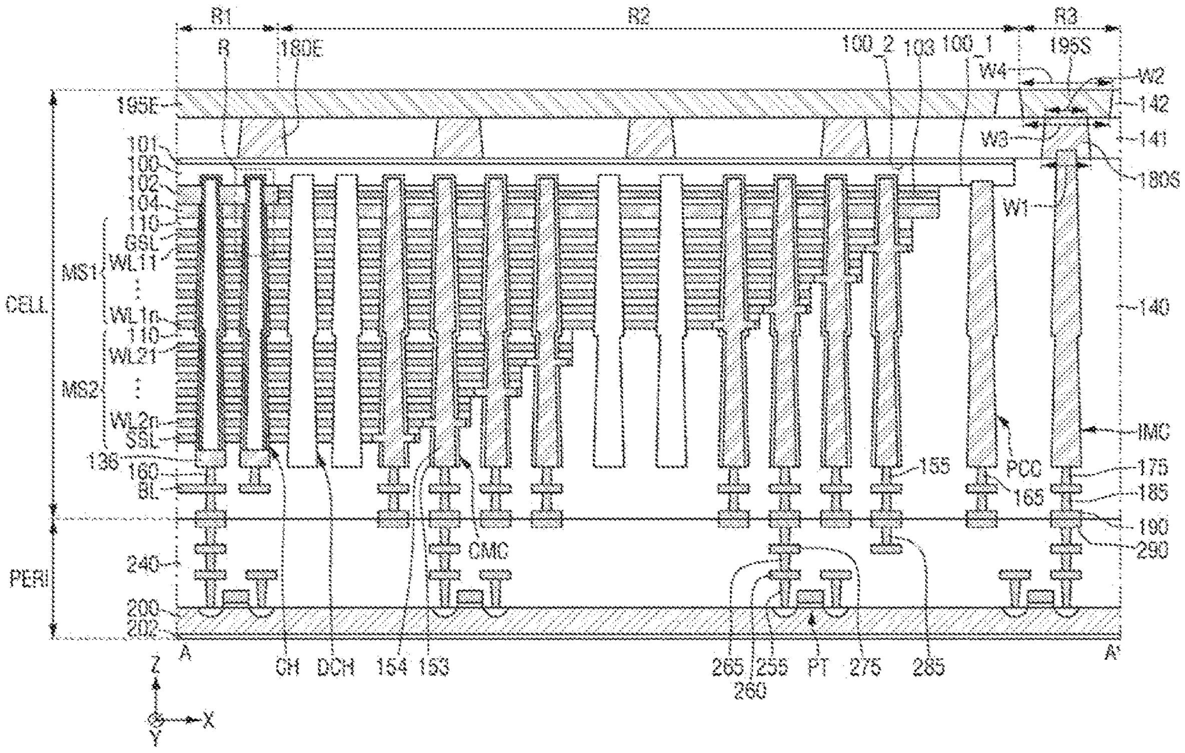
FIG. 7 is a cross-sectional view taken along A-A' in FIG. 5 and FIG. 6 according to some embodiments.
Figure 8:
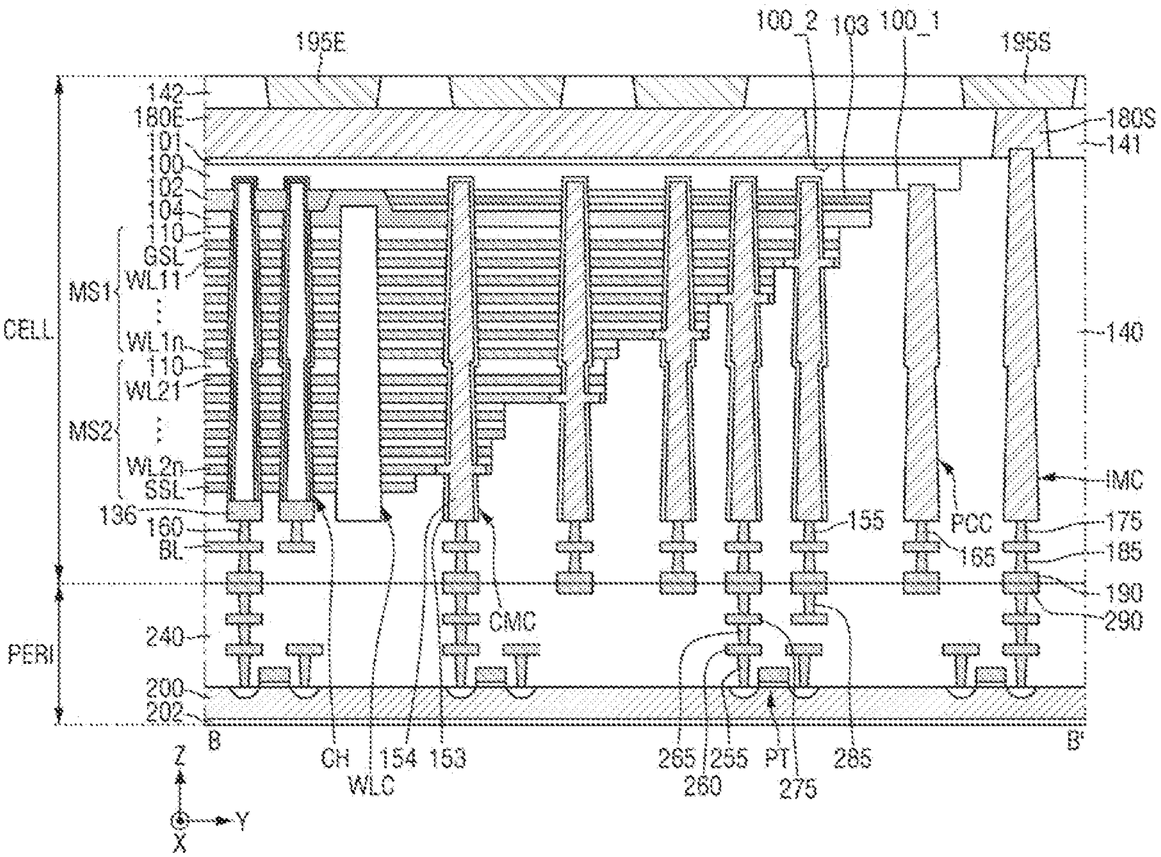
FIG. 8 is a cross-sectional view taken along B-B' in FIG. 5 and FIG. 6 according to some embodiments.
Figure 9:
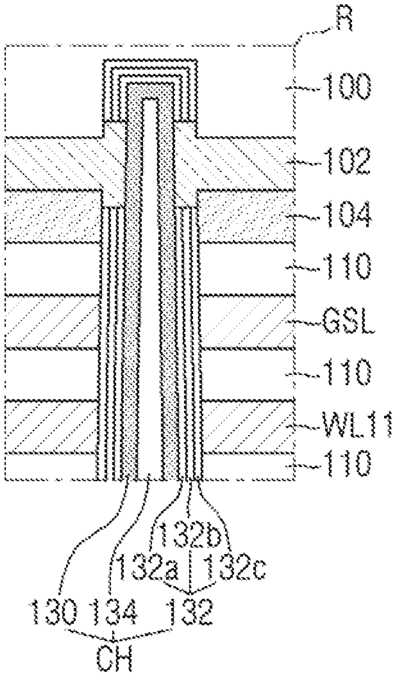
FIG. 9 is an enlarged cross-sectional view to illustrate a R area of FIG. 7 according to some embodiments.

FIGS. 5 to 6 are schematic layout diagrams for illustrating a positional relationship between a via structure and a via connecting structure according to some embodiments. FIG. 7 is a cross-sectional view taken along A-A' in FIG. 5 and FIG. 6. FIG. 8 is a cross-sectional view taken along B-B' in FIG. 5 and FIG. 6. FIG. 9 is an enlarged view to illustrate a R area of FIG. 7.

Referring to FIGS. 5 to 8, the semiconductor device according to some embodiments may include a peripheral circuit structure PERI and a cell structure CELL on the peripheral circuit structure PERI.

The cell structure CELL may include a plate layer 100, via structures 180, via connecting structures 195, gate electrode layers GSL, WL11 to WL1*n*, WL21 to WL2*n*, and SSL, channel structures CH, word-line cutting structures WLC, dummy channel structures DCH, cell contact structures CMC, source contact structures PCC, input/output contact structures IMC, a first insulating layer 141, and a first bonding metal layer 190.

The plate layer 100 may include a first face 100_1 and a second face 100_2 opposite to each other. In an embodiment, in the third direction (Z in FIG. 3), the first face 100_1 may be a bottom face and the second face 1002 may be a top face. In some embodiments, the plate layer 100 may include one of polysilicon doped with impurities and polysilicon that is not doped with impurities. The plate layer 100 may be referred to as a source plate layer and may include a conductive material.

Directions parallel to the first and second faces 100_1 and 100_2 of the plate layer 100 and intersecting each other may be referred to as the first and second directions X and Y, respectively. A direction perpendicular to the first and second faces 100_1 and 100_2 of the plate layer 100 and intersecting the first and second directions X and Y may be referred to as the third direction Z.

The semiconductor device 10 may include first to third areas R1, R2, and R3 sequentially arranged.

The memory cell array (20 in FIG. 1) including a plurality of memory cells may be formed on the first area R1. For example, the channel structure CH, the gate electrodes GSL, WL11 to WL1*n*, WL21 to WL2*n*, and SSL, and the bit-line BL, which will be described later, may be disposed on the first area R1. The memory cell array may be disposed on the first face 100_1 of the plate layer 100.

The second area R2 may be defined around the first area R1. For example, the second area R2 may surround the first area R1 in a plan view. In the second area R2, the gate electrodes GSL, WL11 to WL1*n*, and WL21 to WL2*n*, and SSL, which will be described later, may be stacked in a stepwise manner. The cell contact structure CMC and the dummy channel structure DCH, which will be described later, may be disposed in the second area R2.

The third area R3 may be defined outside the second area R2. For example, the third area R3 may surround the second area R2 in a plan view. The input/output contact structure IMC to be described later may be disposed in the third area R3. The input/output contact structure IMC may be referred to as a through structure.

The via structures 180 may be disposed on the second face 100_2 of the plate layer 100 and may extend in the second direction Y and may be spaced apart from each other along the first direction X. Each of the via structures 180 may be referred to as each of bypass vias.

In an embodiment, in each of the first and second directions X and Y, a width W1 of a bottom face of each of the via structures 180 facing the second face 100_2 of the plate layer 100 may be greater than or equal to a width W2 of a top face of each of the via structures 180. For example, the width of each of the via structures 180 may increase as each of the via structures 180 extends towards the plate layer 100 along the third direction Z.

Since the via structures 180 do not extend through the plate layer 100, the via structures 180 may not directly contact a side face of the plate layer 100.

Each of the via structures 180 may include a first extension 180E disposed in the first and second areas R1 and R2 and extending in the second direction Y, and a first spaced portion 180S disposed in the third area R3 and spaced apart from the first extension 180E in the first and second directions X and Y. The first spaced portion 180S may be connected to one of the input/output contact structures IMC.

The via connecting structures 195 may be disposed on a top face of the via structures 180 and may extend in the first direction X and may be spaced apart from each other along the second direction Y.

In the first and second directions X and Y, a width W3 of a bottom face of each of the via connecting structures 195 facing the top face of the via structures 180 may be less than or equal to a width W4 of a top face of each of the via connecting structures 195. For example, the width of each of the via connecting structures 195 may decrease as each of the via connecting structures 195 extends towards the plate layer 100 along the third direction Z.

Each of the via connecting structures 195 may include a second extension 195E disposed in the first and second areas R1 and R2 and extending in the first direction X, and a second spaced portion 195S disposed in the third area R3 and spaced apart from the second extension 195E in the first and second directions X and Y. The second spaced portion 195S may be connected to one of the input/output contact structures IMC. For example, in an embodiment the second extension 195E may be disposed to overlap the word-line cutting structure WLC in the third direction Z. However, embodiments of the present disclosure are not necessarily limited thereto. Further, in a plan view, each of the word-line cutting structures WLC may not necessarily be limited only to a shape of a continuous line, but may be divided into portions spaced apart from each other.

A length along the first direction X of each of the via structures 180 may be different from a length along the first direction X of each of the via connecting structures 195. For example, a length along the first direction X of the first extension 180E may be different from a length along the first direction X of the second extension 195E. A length of the first spaced portion 180S along the first direction X may be different from a length of the second spaced portion 195S along the first direction X. Further, a length along the second direction Y of the first extension 180E may be different from a length along the second direction Y of the second extension 195E. A length of the first spaced portion 180S along the second direction Y may be different from a length of the second spaced portion 195S along the second direction Y.

The first insulating layer 141 may be disposed on the second face 100_2 of the plate layer 100. The first insulating layer 141 may directly contact a side face of each of the via structures 180. For example, in an embodiment the first insulating layer 141 may include at least one of silicon oxide, silicon oxynitride, and a low-k material having a lower dielectric constant than that of silicon oxide. However, embodiments of the present disclosure are not necessarily limited thereto.

A mold structure MS1 and MS2 may be disposed on the first face 100_1 of the plate layer 100. The mold structure MS1 and MS2 may include a plurality of gate electrodes GSL, WL11 to WL1*n*, WL21 to WL2*n*, and SSL and a plurality of mold insulating films 110 stacked on the plate layer 100. Each of the gate electrodes GSL, WL11 to WL1*n*, WL21 to WL2*n*, and SSL and each of the mold insulating films 110 may have a layered structure extending in a parallel direction to the first face 100_1 of the plate layer 100. The gate electrodes GSL, WL11 to WL1*n*, and WL21 to WL2*n*, and SSL may be sequentially stacked on the plate layer 100 while being spaced apart from each other via the mold insulating films 110. In some embodiments, the erase control line ECL may be omitted, and the ground select line GSL among the gate electrodes GSL, WL11 to WL1*n*, and WL21 to WL2*n*, and SSL may be closest to the first face 100_1 of the plate layer 100.

In some embodiments, as shown in FIG. 7, the mold structure MS1 and MS2 may include a first mold structure MS1 and a second mold structure MS2 sequentially stacked on the plate layer 100.

In an embodiment, the first mold structure MS1 may include first gate electrodes GSL, and WL11 to WL1*n*, and the mold insulating films 110 alternately stacked on top of each other while being disposed on the first face 100_1 of the plate layer 100. In some embodiments, the first gate electrodes GSL, and WL11 to WL1*n* may include the ground select line GSL and a plurality of first word-lines WL11 to WL1*n* sequentially stacked on the plate layer 100. The number and arrangement of the ground select line GSL and the first word-lines WL11 to WL1*n* are merely examples and are not necessarily limited to those shown in FIGS. 7-8.

In an embodiment, the second mold structure MS2 may include second gate electrodes WL21 to WL2*n*, and SSL and mold insulating films 110 alternately stacked on top of each other while being disposed on the first mold structure MS1. In some embodiments, the second gate electrodes WL21 to WL2*n* and SSL may include a plurality of second word-lines WL21 to WL2*n* and the string select line SSL sequentially stacked on the first mold structure MS1. The number and arrangement of the second word-lines WL21 to WL2*n* and the string select line SSL are merely examples and are not necessarily limited to those shown in FIGS. 7-8.

In an embodiment, each of the gate electrodes GSL, WL11 to WL1*n*, and WL21 to WL2*n*, and SSL may include a conductive material, for example, a metal such as tungsten (W), cobalt (Co), or nickel Ni or a semiconductor material such as silicon. However, embodiments of the present disclosure are not necessarily limited thereto.

In an embodiment, each of the mold insulating films 110 may include an insulating material, for example, at least one of silicon oxide, silicon nitride, and silicon oxynitride. However, embodiments of the present disclosure are not necessarily limited thereto.

The interlayer insulating film 140 may be formed on the first face 100_1 of the plate layer 100 so as to cover the mold structure MS1 and MS2. In some embodiments, the interlayer insulating film 140 may include a stack of interlayer insulating films sequentially stacked on the plate layer 100. In an embodiment, the interlayer insulating film 140 may include, for example, at least one of silicon oxide, silicon oxynitride, and a low-k material having a lower dielectric constant than that of silicon oxide. However, embodiments of the present disclosure are not necessarily limited thereto.

The channel structure CH may be disposed on the first face 100_1 of the plate layer 100 and in the first area R1 thereof. The channel structure CH may extend in a direction (hereinafter, the third direction Z) intersecting the first face 100_1 of the plate layer 100 so as to extend through the mold structure MS1 and MS2. For example, in an embodiment the channel structure CH may have a pillar shape (e.g., a cylindrical shape) extending in the third direction Z. Accordingly, the channel structure CH may intersect the plurality of gate electrodes GSL, WL11 to WL1*n*, and WL21 to WL2*n*, and SSL.

The channel structure CH may include a portion having a width that decreases as the portion extends towards the first face 100_1 of the plate layer 100. In some embodiments, the channel structure CH may have a bent portion between the first mold structure MS1 and the second mold structure MS2. The channel structure CH may have a first portion in the first mold structure MS1 having a width that decreases as the first portion extends towards the first face 100_1 of the plate layer 100 and may have a second portion in the second mold structure MS2 having a width that decreases as the second portion extends towards the first face 100_1 of the plate layer 100. In an embodiment, the tapered widths of the first and second mold structures MS1, MS2 may be due to characteristics of an etching process to form the channel structure CH.

The channel structure CH may include a semiconductor pattern 130 and an information storage film 132.

The semiconductor pattern 130 may extend in the third direction Z to extend through the first mold structure MS1 and the second mold structure MS2. In an embodiment, as shown in FIG. 9, the semiconductor pattern 130 may have a shape of a cup. However, this is only illustrative and embodiments of the present disclosure are not necessarily limited thereto. For example, the semiconductor pattern 130 may have various shapes, such as a cylindrical shape, a rectangular cylindrical shape, and a solid pillar shape. In an embodiment, the semiconductor pattern 130 may include, but is not necessarily limited to, semiconductor materials such as single crystal silicon, polycrystalline silicon, organic semiconductor materials, and carbon nanostructures.

The information storage film 132 may be interposed between the semiconductor pattern 130 and each of the gate electrodes ECL, GSL, WL11 to WL1*n*, and WL21 to WL2*n*, and SSL. For example, the information storage film 132 may extend along an outer face of the semiconductor pattern 130. In an embodiment, the information storage film 132 may include, for example, at least one of silicon oxide, silicon nitride, silicon oxynitride, and a high dielectric constant material having a dielectric constant greater than that of silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the plurality of channel structures CH may be arranged in a zigzag manner. For example, as shown in FIG. 5, the plurality of channel structures CH may arranged in a staggered manner in each of the first direction X and the second direction Y. The plurality of channel structures CH arranged in the zigzag manner may further increase integration of the semiconductor memory device. In some embodiments, the plurality of channel structures CH may be arranged in a form of a honeycomb.

In some embodiments, the information storage film 132 may be embodied as a multilayer. For example, as shown in FIG. 9, the information storage film 132 may include a tunnel insulating film 132*a*, a charge storage film 132*b*, and a blocking insulating film 132*c* that are sequentially stacked on an outer side face of the semiconductor pattern 130.

In an embodiment, the tunnel insulating film 132*a* may include, for example, silicon oxide or a high dielectric constant material (e.g., aluminum oxide ($Al_2O_3$) or hafnium oxide ($HfO_2$)) having a higher dielectric constant than that of silicon oxide. The charge storage film 132*b* may include, for example, silicon nitride. The blocking insulating film 132*c* may include, for example, silicon oxide or a high dielectric constant material (e.g., aluminum oxide ($Al_2O_3$) or hafnium oxide ($HfO_2$)) having a higher dielectric constant than that of silicon oxide.

In some embodiments, the channel structure CH may further include a filling pattern 134. The filling pattern 134 may be formed to fill an inner space defined by the cup-shaped semiconductor pattern 130. The filling pattern 134 may include an insulating material, for example, silicon oxide. However, embodiments of the present disclosure are not necessarily limited thereto.

In some embodiments, the channel structure CH may further include a channel pad 136. The channel pad 136 may be formed to be connected to the semiconductor pattern 130. For example, the channel pad 136 may be formed in the interlayer insulating film 140 so as to be connected to a top of the semiconductor pattern 130. The channel pad 136 may include, for example, polysilicon doped with impurities. However, embodiments of the present disclosure are not necessarily limited thereto.

In some embodiments, the cell structure CELL may further include a source layer 102 on the plate layer 100 and a source support layer 104 on the source layer 102. The source layer 102 may be interposed between the plate layer 100 and the first mold structure MS1 (e.g., in the third direction Z). For example, the source layer 102 may extend along the first face 100_1 of the plate layer 100. The source layer 102 may be formed to be connected to the semiconductor pattern 130 of the channel structure CH. For example, as shown in FIG. 9, the source layer 102 may extend through the information storage film 132 so as to directly contact the semiconductor pattern 130. This source layer 102 may act as the common source line (e.g., CSL of FIG. 3) of the semiconductor device 10. However, the channel structure CH may not be directly connected to the peripheral circuit structure PERI In an embodiment, the source support layer 104 may act as a support layer to prevent collapse of the mold stack in an alternative replacement process to form the source layer 102.

In an embodiment, each of the source layer 102 and the source support layer 104 may include, but is not necessarily limited to, polysilicon doped with impurities or polysilicon undoped with impurities.

Each of the word-line cutting structures WLC may extend in the third direction Z so as to cut the first mold structure MS1 and the second mold structure MS2. The first mold structure MS1 and the second mold structure MS2 may be cut by each of the word-line cutting structures WLC to form the plurality of memory cell blocks (e.g., BLK1 to BLKn in FIG. 1). For example, in an embodiment two adjacent word-line cutting structures WLC may define one memory cell block therebetween. The plurality of channel structures CH may be disposed in each of the memory cell blocks defined by the word-line cutting structures WLC.

In some embodiments, the word-line cutting structures WLC may extend in the third direction Z so as to cut (e.g., extend through) the source layer 102. A bottom face of each of the word-line cutting structures WLC may be coplanar (e.g., in the third direction Z) with a bottom face of the source layer 102. However, this is only an example and embodiments of the present disclosure are not necessarily limited thereto. For example, in another embodiment, the bottom face of each of the word-line cutting structures WLC may not be coplanar with the bottom face of the source layer 102.

In some embodiments, the word-line cutting structures WLC disposed in the first area R1 may extend through the source layer 102, while the word-line cutting structures WLC disposed in the second and third areas R2 and R3 may not extend through the source layer 102.

In some embodiments, each of the word-line cutting structures WLC may include an insulating material. For example, the insulating material may fill each of the word-line cutting structures WLC. In an embodiment, the insulating material may include, for example, at least one of silicon oxide, silicon nitride, and silicon oxynitride. However, embodiments of the present disclosure are not necessarily limited thereto.

In some embodiments, a string isolation structure may be formed in the second mold structure MS2. The string isolation structure may extend in the third direction Z so as to cut the string select line SSL. Each of the memory cell blocks defined by the word-line cutting structures WLC may be divided into a plurality of string areas via the string isolation structure.

The bit-line BL may be formed on the second mold structure MS2 and the interlayer insulating film 140. The bit-line BL may extend in the second direction Y so as to intersect the word-line cutting structures WLC. Further, the bit-line BL may extend in the second direction Y so as to be connected to the plurality of channel structures CH arranged along the second direction Y. For example, a bit-line contact 160 connected to a top of each of the channel structures CH may be formed in the interlayer insulating film 140. The bit-line BL may be electrically connected to the channel structures CH via the bit-line contact 160.

The dummy channel structures DCH may extend in the third direction Z, and may extend through the interlayer insulating film 140 and the mold structure MS1 and MS2 in the second area R2. Unlike the channel structures CH, the dummy channel structures DCH do not function as a channel of the transistor. For example, the dummy channel structures DCH are not electrically connected to (e.g., are electrically isolated from) the bit-line BL and the gate electrodes GSL, WL1 to WLn, WL2 to WL2*n*, and SSL, which will be described later. Each of the dummy channel structures DCH may be formed in a shape similar to that of each of the channel structures CH, so that stress applied to a portion of the mold structure MS1 and MS2 in the second area R2 may be reduced. In an embodiment, the dummy channel structures DCH may act as a pillar (e.g., a support) that physically supports the gate electrodes GSL, WL1 to WLn, WL2 to WL2*n*, and SSL stacked in a stepped manner. Each of the dummy channel structures DCH may include, for example, an insulating material. Alternatively, each of the dummy channel structures DCH may include the same film as that of each of the channel structures CH, but may not be connected to the bit-line BL.

The cell contact structures CMC may be disposed on the plate layer 100. The cell contact structures CMC may extend in the third direction Z and extend through the interlayer insulating film 140 and the mold structure MS1 and MS2 in the second area R2. Each of the cell contact structures CMC may include a portion having a width that decreases as the portion extends towards the first face 100_1 of the plate layer 100. In some embodiments, the cell contact structures CMC may have a bent portion between the first mold structure MS1 and the second mold structure MS2. The cell contact structures CMC may have a first portion in the first mold structure MS1 having a width that decreases as the first portion extends towards the first face 100_1 of the plate layer 100, and a second portion in the second mold structure MS2 having a width that decreases as the second portion extends towards the first face 100_1 of the plate layer 100. In an embodiment, the tapered width of the cell contact structures CMC may be due to characteristics of an etching process for forming the cell contact structure CMC.

Each of the cell contact structures CMC may be electrically connected to the gate electrodes ECL, GSL, WL1 to WLn, and SSL in the second area R2. Each of the cell contact structures CMC may be electrically connected to one of the gate electrodes ECL, GSL, WL11 to WL1*n*, and WL21 to WL2*n*, and SSL.

Each of the cell contact structures CMC may include a first spacer film 153 and a first filling film 154. The first filling film 154 may extend through the interlayer insulating film 140 and the mold structure MS1 and MS2. The first spacer film 153 may extend along a side face of the first filling film 154 and a top face thereof in the third direction Z. The first spacer film 153 is not disposed between each of the gate electrodes GSL, WL1 to WLn, WL2 to WL2*n*, SSL and the cell contact structure CMC which are in direct contact with each other. For example, the first spacer film 153 may include an insulating material and, the first filling film 154 may include a conductive material.

In some embodiments, a portion of the cell contact structure CMC in direct contact with the gate electrodes GSL, WL1 to WLn, WL2 to WL2*n*, and SSL may protrude from a sidewall of the cell contact structure CMC. A thickness of a sidewall of a portion of the gate electrode in direct contact with the cell contact structure CMC may be greater than a thickness of a sidewall of a portion of the gate electrode not in direct contact with the cell contact structure CMC. However, embodiments of the present disclosure are not necessarily limited thereto.

The cell contact structures CMC may be electrically connected to the bit-line BL via a first contact 155. The first contact 155 may include a conductive material. In an embodiment, the first contact 155 may include, for example, tungsten (W) or copper (Cu). However, embodiments of the present disclosure are not necessarily limited thereto.

The source contact structures PCC may be disposed in the second area R2. The source contact structures PCC may extend (e.g., in the third direction Z) through at least a portion of each of the interlayer insulating film 140 and the plate layer 100 in the second area R2. The source contact structures PCC may not extend through the gate electrodes ECL, GSL, WL11 to WL1*n*, WL21 to WL2*n*, and SSL. The source contact structures PCC may extend through at least a portion of the source layer 102 and may be electrically connected to the source layer 102. In an embodiment, the source layer 102 may receive a voltage from the source contact structure PCC so as to maintain a ground voltage. The source contact structures PCC may not be directly connected to the peripheral circuit structure PERI. However, embodiments of the present disclosure are not necessarily limited thereto. The bit-line BL may be electrically connected to the source contact structure PCC via a second contact 165. The source contact structures PCC may have portions having a tapered shape with a width that decreases as the portion extends towards the first face 100_1 of the plate layer 100.

The input/output contact structures IMC may be disposed in the third area R3. The Input/output contact structures IMC may not be disposed on the plate layer 100. The cell structure CELL (e.g., a second substrate structure) may be electrically connected to a peripheral circuit element PT of the peripheral circuit structure PERI via the input/output contact structures IMC. The input/output contact structures IMC may extend in the third direction Z and may extend through the interlayer insulating film 140 so as to be electrically connected to the second spaced portion 195S. Each of the input/output contact structures IMC may include a portion having a width that decreases as the portion extends towards the first face 100_1 of the plate layer 100. In some embodiments, the input/output contact structures IMC may have a bent portion between the first mold structure MS1 and the second mold structure MS2. Each of the input/output contact structures IMC may have a first portion in the first mold structure MS1 having a width that decreases as the first portion extends towards the first face 100_1 of the plate layer 100, and a second portion in the second mold structure MS2 having a width that decreases as the second portion extends towards the first face 100_1 of the plate layer 100. In an embodiment, the tapered portions of the input/output contact structures IMC may be due to characteristics of an etching process for forming the input/output contact structure IMC.

In an embodiment, each of the source contact structures PCC and the input/output contact structures IMC may include, but is not necessarily limited to, a conductive material, for example, a metal such as tungsten (W), cobalt (Co), or nickel (Ni), or a semiconductor material such as silicon. For example, each of the source contact structures PCC and the input/output contact structures IMC may include tungsten (W).

The input/output contact structures IMC may be electrically connected to the bit-line BL via a third contact 175. The third contact 175 may include a conductive material. For example, in an embodiment, the third contact 175 may include, but is not necessarily limited to, tungsten (W) or copper (Cu).

The via connecting structures 195 may be formed on the second face 100_2 of the plate layer 100. For example, the via connecting structures 195 may be formed on the second face 100_2 of the plate layer 100 and on the first insulating layer 141. The via connecting structures 195 may be electrically connected to the input/output contact structures IMC via the via structures 180. The via connecting structures 195 may be electrically connected to the peripheral circuit structure PERI via the via structures 180 and the input/output contact structures IMC. The via connecting structures 195 may electrically connect an external device and an external semiconductor device. In an embodiment, each of the via connecting structures 195 may include, but is not necessarily limited to, aluminum (Al).

The peripheral circuit structure PERI (e.g., a first substrate structure) may include a peripheral circuit substrate 200, the peripheral circuit element PT, a second insulating layer 202, an interlayer insulating film 240, a plurality of wiring patterns 260 and 275, a plurality of wiring contacts 255 and 265 and a second bonding metal layers 290.

In an embodiment, the peripheral circuit substrate 200 may include, for example, a semiconductor substrate such as a silicon substrate, a germanium substrate, or a silicon-germanium substrate. Alternatively, the peripheral circuit substrate 200 may be embodied as a silicon-on-insulator (SOI) substrate or a germanium-on-insulator (GOI) substrate, etc. However, embodiments of the present disclosure are not necessarily limited thereto.

The peripheral circuit element PT may be formed on the peripheral circuit substrate 200. The peripheral circuit element PT may constitute the peripheral circuit (e.g., 30 in FIG. 1) that controls an operation of the semiconductor device. For example, the peripheral circuit element PT may include the control logic (e.g., 37 of FIG. 1), the row decoder (e.g., 33 of FIG. 1) and the page buffer (e.g., 35 of FIG. 1)). In following descriptions, a surface of the peripheral circuit substrate 200 on which the peripheral circuit element PT is disposed may be referred to as a front face of the peripheral circuit substrate 200. A surface of the peripheral circuit substrate 200 opposite (e.g., in the third direction Z) to the front face of the peripheral circuit substrate 200 may be referred to as a rear face of the peripheral circuit substrate 200.

In an embodiment, the peripheral circuit element PT may include, for example, a transistor. However, embodiments of the present disclosure are not necessarily limited thereto. For example, in some embodiments the peripheral circuit element PT may include not only various active elements such as a transistor, but also various passive elements such as a capacitor, a resistor, and an inductor.

The interlayer insulating film 240 may be disposed on the front face of the peripheral circuit substrate 200. The plurality of wiring patterns 260 and 275 and the plurality of wiring contacts 255 and 265 may be disposed in the interlayer insulating film 240. The interlayer insulating film 240 may include an insulating material.

For example, in an embodiment the interlayer insulating film 240 may include at least one of silicon oxide, silicon oxynitride, and a low-k material having a lower dielectric constant than that of silicon oxide. However, embodiments of the present disclosure are not necessarily limited thereto.

The plurality of wiring patterns 260 and 275 and the plurality of wiring contacts 255 and 265 may be electrically connected to each other. The peripheral circuit element PT and the bit-lines BL may be electrically connected to each other via the plurality of wiring patterns 260 and 275 and the plurality of wiring contacts 255 and 265. Each of the plurality of wiring patterns 260 and 275 and the plurality of wiring contacts 255 and 265 may include a conductive material. In an embodiment, each of the plurality of wiring patterns 260 and 275 and the plurality of wiring contacts 255 and 265 may include, but is not necessarily limited to, tungsten (W) or copper (Cu).

The semiconductor device according to some embodiments may have a C2C (chip-to-chip) structure. The C2C structure may be formed by manufacturing an upper chip including a first wafer and the cell structure CELL on the first wafer, and then manufacturing a lower chip including a second wafer different from the first wafer and the peripheral circuit structure PERI on the second wafer, and then coupling the upper chip and the lower chip to each other in a bonding scheme.

In an embodiment, the bonding scheme may refer to a scheme of electrically connecting the first bonding metal layer 190 as the uppermost metal layer of the upper chip (e.g., in a direction from the second face 100_2 of the plate layer 100 to the first face 100_2 thereof) and the second bonding metal layer 290 as the uppermost metal layer of the lower chip (e.g., in a direction from the front face to the rear face of the peripheral circuit substrate 200) to each other. For example, in an embodiment in which each of the first and second bonding metal layers 190 and 290 is made of copper (Cu), the bonding scheme may be a Cu—Cu bonding scheme. Alternatively, each of the first and second bonding metal layers 190 and 290 may be made of aluminum (Al) or tungsten (W). However, embodiments of the present disclosure are not necessarily limited thereto.

The first bonding metal layer 190 may be connected to the bit-line BL via a first bonding contact 185. The second bonding metal layer 290 may be connected to the peripheral circuit elements PT via a second bonding contact 285. In this way, the peripheral circuit structure PERI and the cell structure CELL may be electrically connected to each other.

Figure 10:
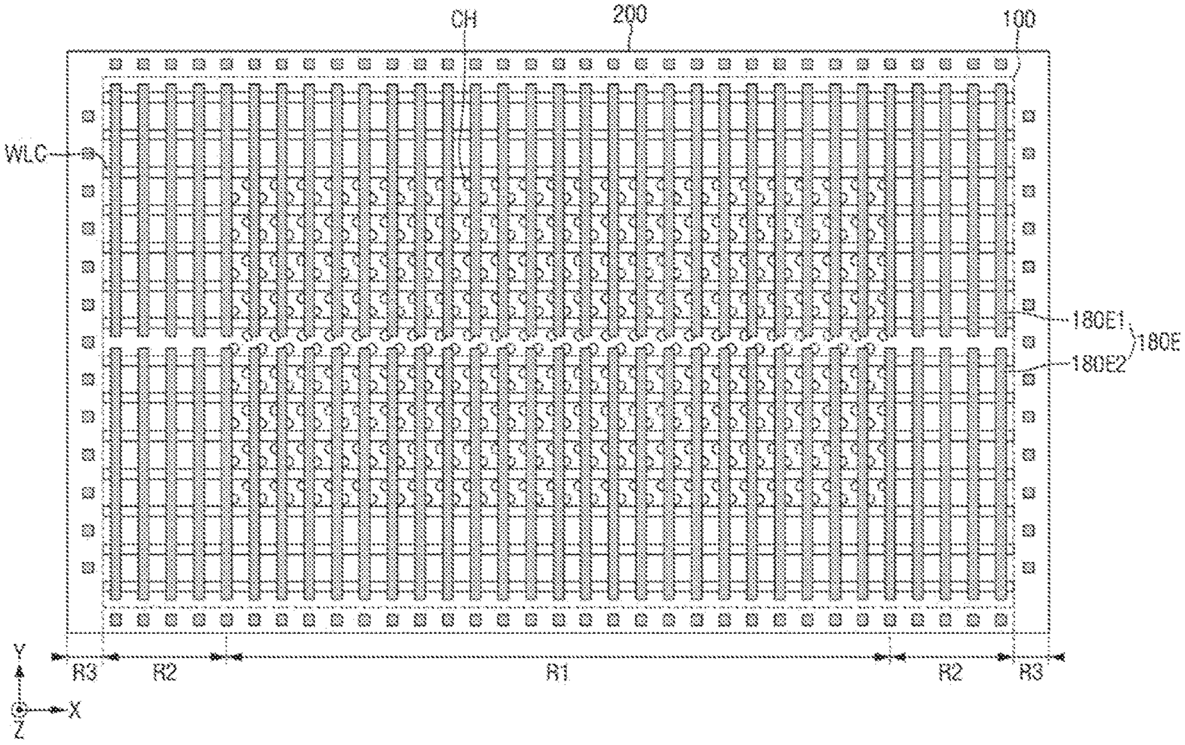
FIGS. 10 to 12 are schematic layout diagrams for illustrating a positional relationship between a via structure and a via connecting structure according to some embodiments.
Figure 11:
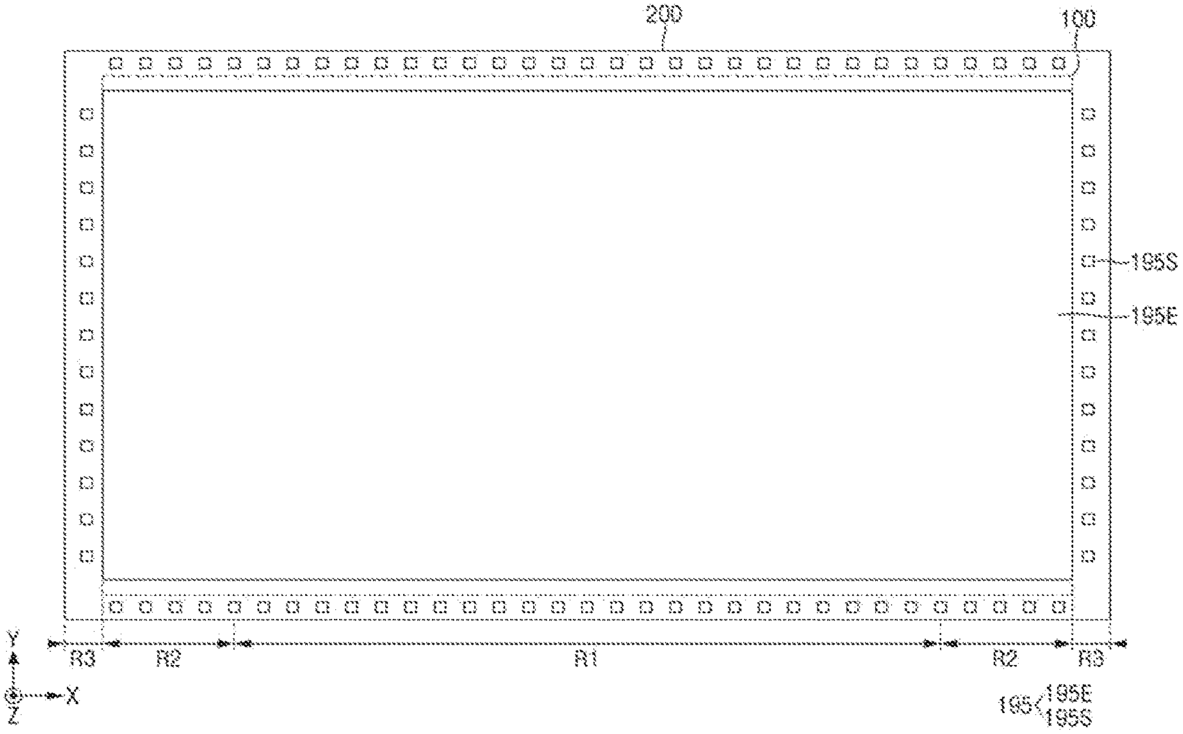
Figure 12:
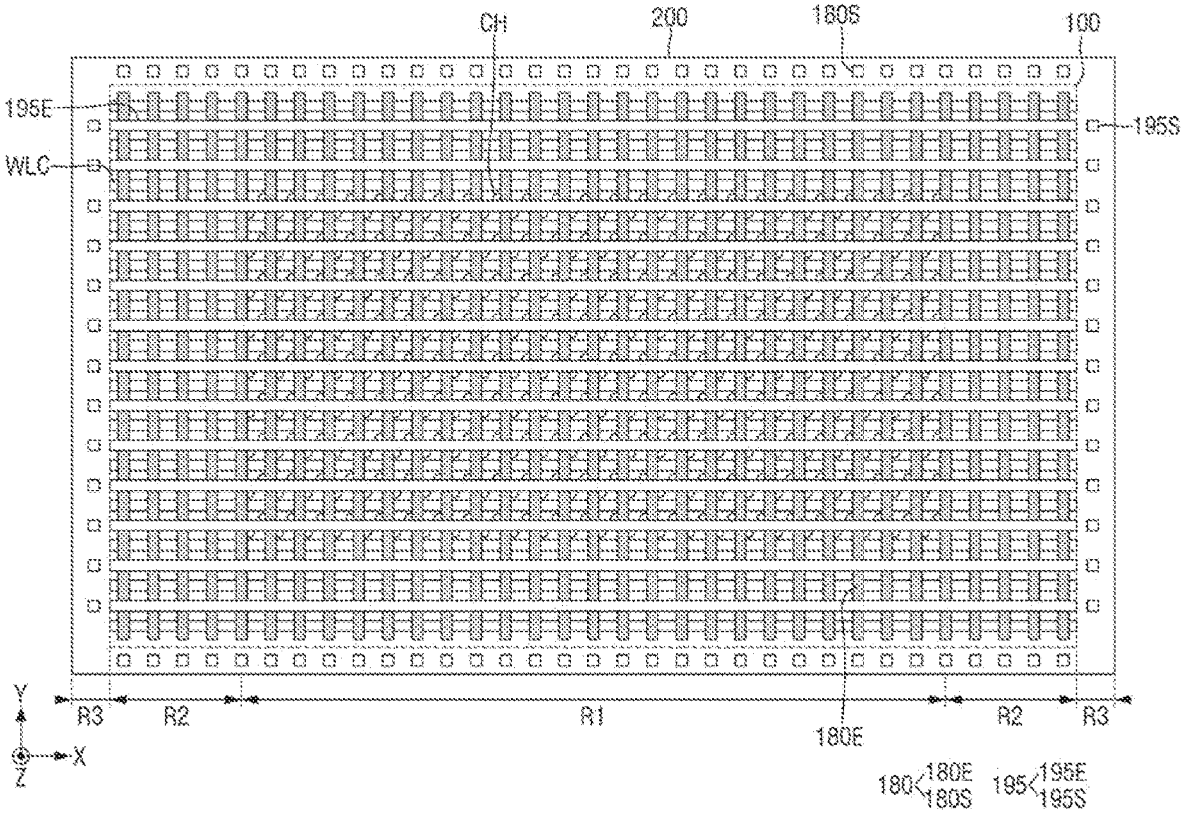

FIGS. 10 to 12 are schematic layout diagrams for illustrating a positional relationship between the via structure and the via connecting structure (e.g., via connecting patterns) according to some embodiments. For convenience of description, following descriptions are based on differences thereof from those as set forth with reference to FIGS. 1 to 9 and a repeated description of identical or similar elements may be omitted for economy of description.

Referring to FIG. 10, in an embodiment, in a plan view, the first extension 180E may include a plurality of extensions, such as a first_first extension 180E1 and a first_second extension 180E2 spaced apart from each other in the second direction Y. In FIG. 10, it is illustrated that the number of the first extensions 180E spaced apart from each other is two. However, embodiments of the present disclosure are not necessarily limited thereto, and the number of the plurality of first extensions 180E spaced apart from each other may be three or more in some embodiments.

Referring to FIG. 11, in a plan view, the second extension 195E may be provided in a form of a plate while being disposed on the word-line cutting structures WLC. The second extension 195E may be provided in a shape extending in each of the first and second directions X and Y while being disposed on the word-line cutting structures WLC.

Referring to FIG. 12, in a plan view, the second extensions 195E and the word-line cutting structures WLC may be arranged alternately with each other in the second direction Y. The second extension 195E may not overlap the word-line cutting structures WLC in the third direction Z.

FIGS. 13 to 29 are cross-sectional views of intermediate structures corresponding to intermediate steps for illustrating a method of manufacturing a semiconductor device according to some embodiments. For convenience of description, following descriptions are based on differences thereof from those as set forth with reference to FIGS. 1 to 12 and a repeated description of similar or identical features may be omitted for economy of description. For reference, FIG. 14, FIG. 16, FIG. 18, FIG. 20, FIG. 22, FIG. 24, FIG. 26, and FIG. 28 are cross-sectional views corresponding to FIG. 7, while FIG. 15, FIG. 17, FIG. 19, FIG. 21, FIG. 23, FIG. 25, FIG. 27, and FIG. 29 are cross-sectional views corresponding to FIG. 8.

Figure 13:
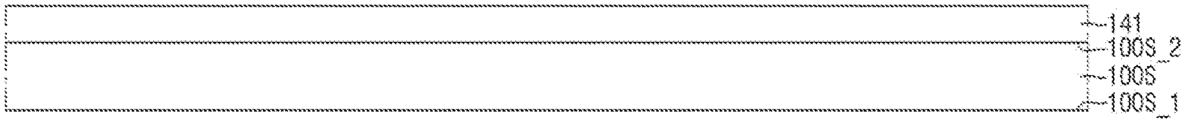
FIGS. 13 to 29 are cross-sectional views of intermediate structures corresponding to intermediate steps for illustrating a method of manufacturing a semiconductor device according to some embodiments.

Referring to FIG. 13, a cell substrate 100S including first and second faces 100S_1 and 100S_2 facing each other may be provided. In an embodiment, the cell substrate 100S may be embodied as a silicon wafer. The first insulating layer 141 in which the via structure 180 to be described later will be formed may be deposited on the cell substrate 100S. The first insulating layer 141 may be formed on the second face 100S_2 of the cell substrate 100S.

Figure 14:
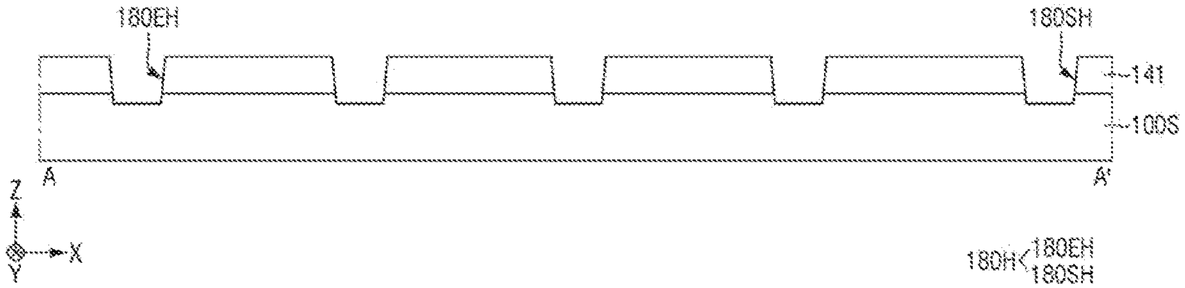
Figure 15:
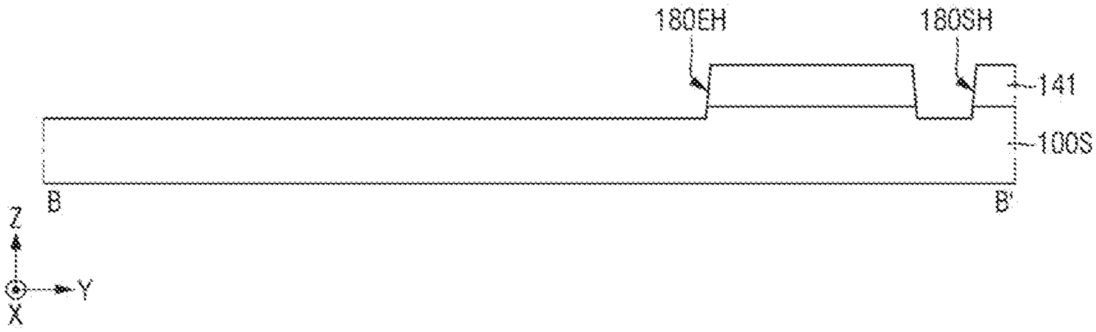

Referring to FIG. 14 and FIG. 15, via structure holes 180H spaced apart from each other may be formed in the cell substrate 100S. The via structure holes 180H may include a first via structure hole 180EH in which the first extension 180E will be formed and a second via structure hole 180SH in which the first spaced portion 180S will be formed.

In a plan view, the via structure hole 180H may extend in a direction intersecting with a word-line cutting structure hole in which the word-line cutting structure WLC is to be formed. In an embodiment, the via structure hole 180H may be formed by etching at least a portion of each of the first insulating layer 141 and the cell substrate 100S using a mask formed on the first insulating layer 141 and the cell substrate 100S.

Figure 16:
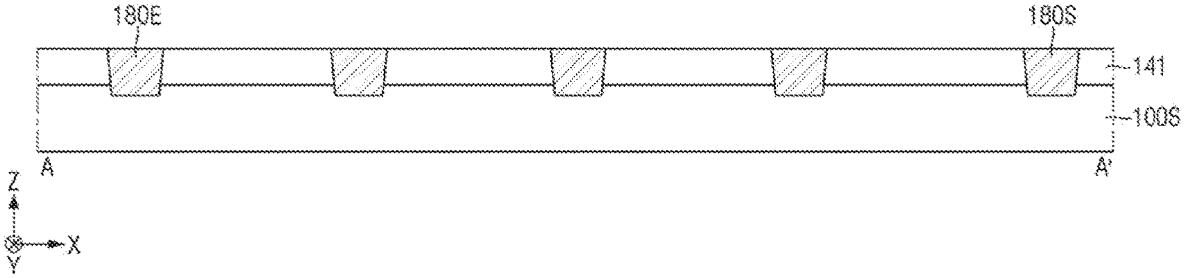
Figure 17:
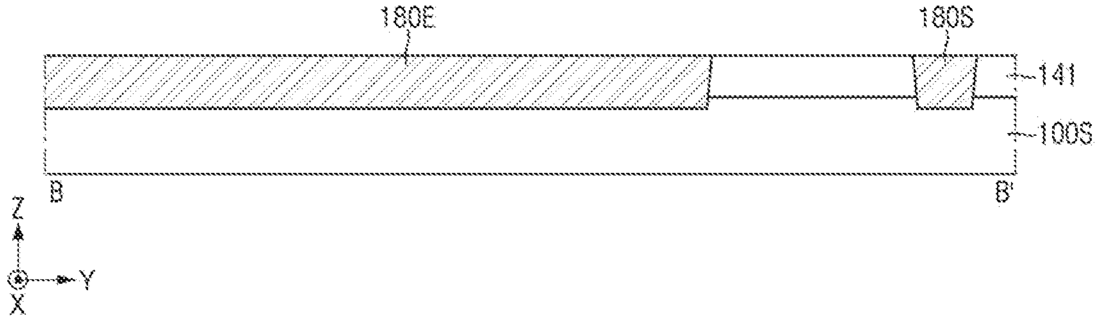

Referring to FIG. 16 and FIG. 17, the via structure 180 including the first extension 180E and the first spaced portion 180S may be formed in the via structure hole 180H. In an embodiment, the via structure 180 may be made of the same material as that of each of the gate electrode layers as described later and may be formed in the via structure hole 180H. For example, the via structures 180 may include tungsten (W). However, embodiments of the present disclosure are not necessarily limited thereto.

In a process of forming the gate electrode layers, which will be described later, different types of forces may act on the wafer of the semiconductor device 10 in the first direction X and the second direction Y. According to some embodiments, the via structures 180 may extend in the second direction Y that intersects the first direction X in which the word-line cutting structures WLC extend, such that the wafer may be prevented from being deformed into a saddle shape under the action of the aforementioned forces.

Thereafter, a planarization process may be performed on a top face of the via structures 180 and a top face of the first insulating layer 141. For example, in an embodiment the planarization process may be embodied as a chemical mechanical polishing (CMP) process. However, embodiments of the present disclosure are not necessarily limited thereto.

Figure 18:
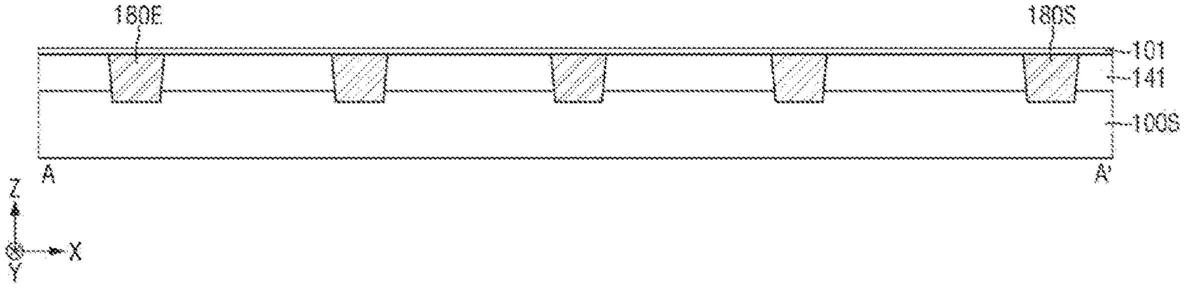
Figure 19:
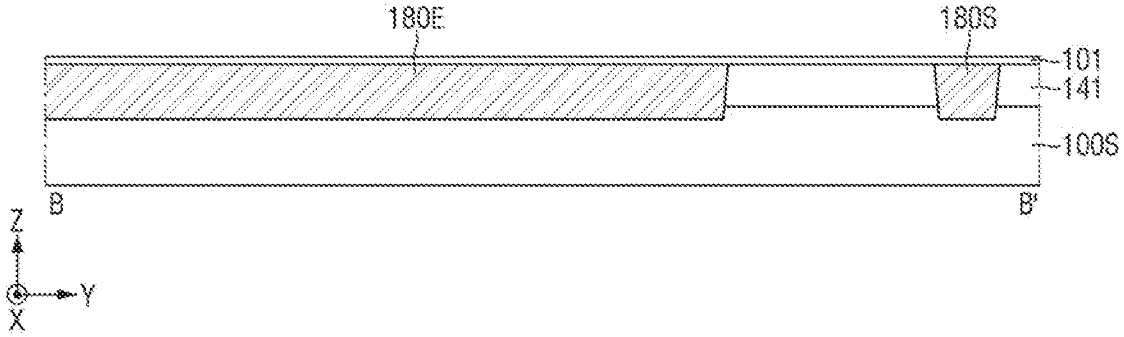

Referring to FIG. 18 and FIG. 19, a barrier layer 101 may be formed on a planarized top face of the first insulating layer 141 and a planarized top face of the via structures 180. For example, the barrier layer 101 may include, but is not necessarily limited to, titanium nitride (TiN). In an embodiment, the barrier layer 101 may be used to prevent unnecessary reaction between the via structures 180 including tungsten (W) and the plate layer 100 including polysilicon.

Figure 20:
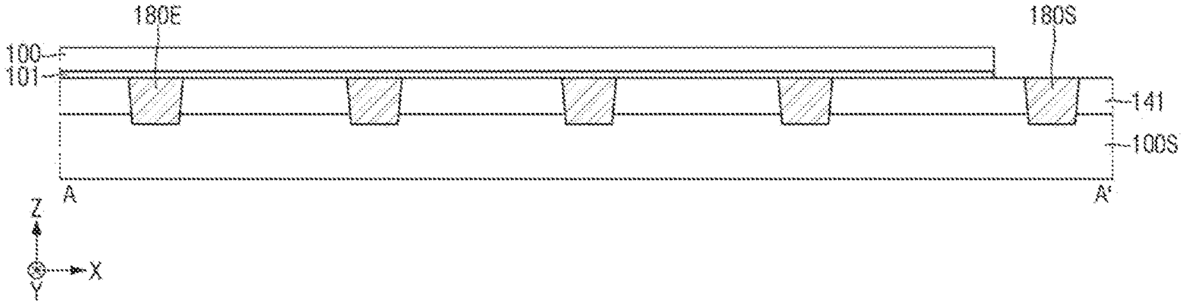
Figure 21:
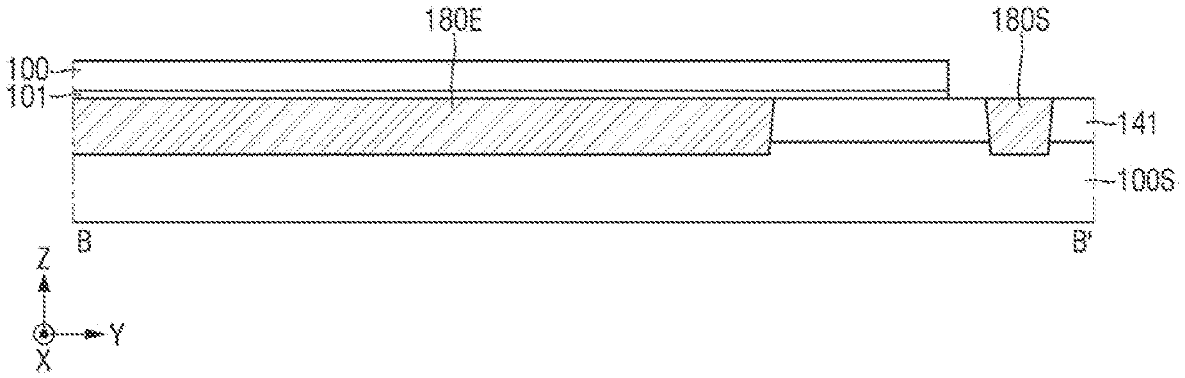

Referring to FIG. 20 and FIG. 21, the plate layer 100 may be formed on (e.g., formed directly thereon) the barrier layer 101. Thereafter, at least a portion of each of the plate layer 100 and the barrier layer 101 in an area where the input/output contact structure IMC is to be disposed may be removed. Accordingly, the first spaced portion 180S of the via structure 180 that will be connected to the input/output contact structure IMC may be exposed.

According to some embodiments, the via structures 180 may be formed between the cell substrate 100S and the plate layer 100, such that the cell substrate 100S and the plate layer 100 may be grounded to prevent arcing.

Figure 22:
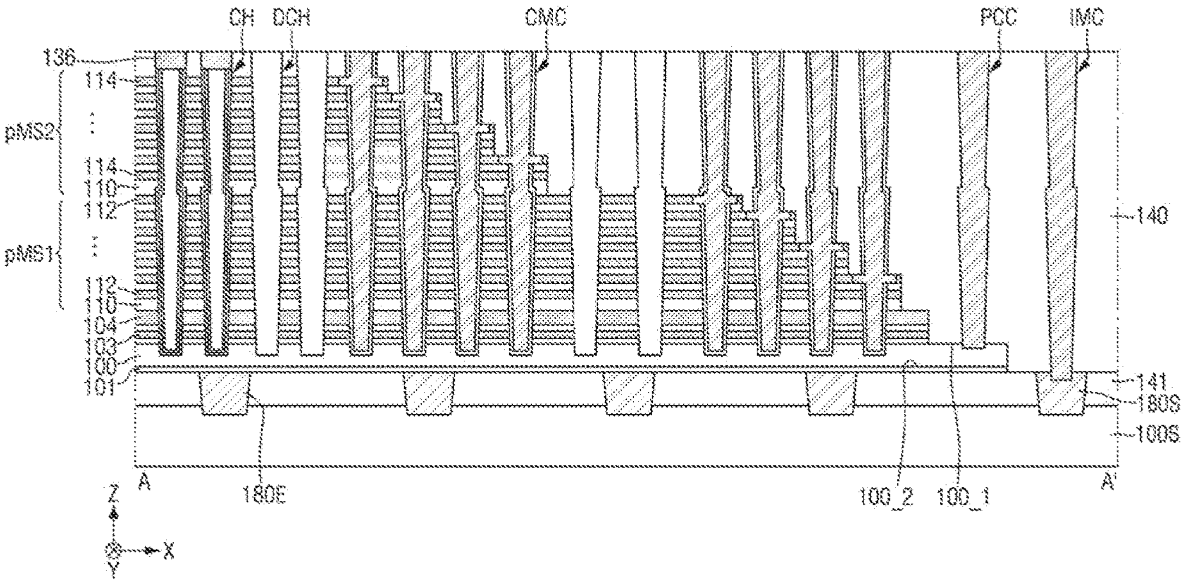
Figure 23:
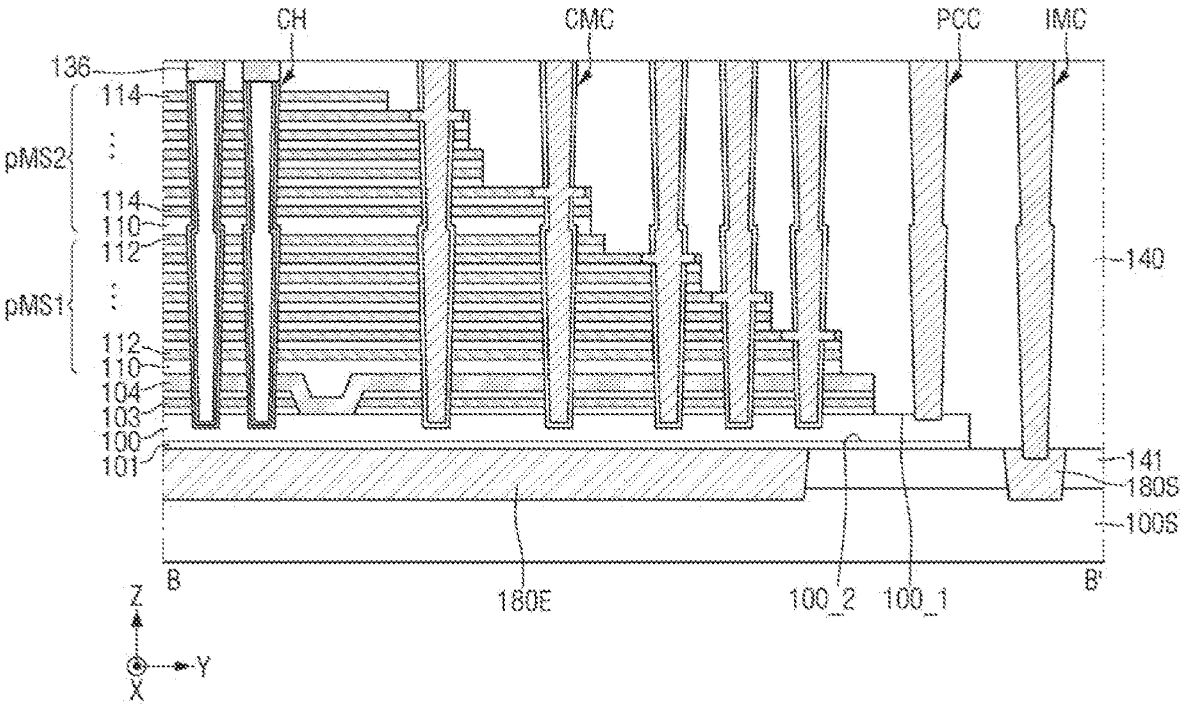

Referring to FIG. 22 and FIG. 23, a nitride layer 103 and a first pre-mold pMS1 may be formed on the plate layer 100. In an embodiment, the nitride layer 103 may be replaced with the source layer 102 in direct contact with the channel structure CH in the first area R1, and may remain in the second and third areas R3. In an embodiment, the nitride layer 103 may include, but is not necessarily limited to, silicon nitride (SiN).

The first pre-mold pMS1 may be formed on the first face 100_1 of the plate layer 100. The first pre-mold pMS1 may include a plurality of first mold insulating films 110 and a plurality of first mold sacrificial films 112 that are alternately stacked on top of each other (e.g., in the third direction Z) while being disposed on the plate layer 100. In an embodiment, the first mold sacrificial film 112 may include a material having an etching selectivity with respect to a material of the first mold insulating film 110. For example, in an embodiment the first mold insulating film 110 may include a silicon oxide film, and the first mold sacrificial film 112 may include a silicon nitride film.

A portion of the first pre-mold pMS1 on the second area R2 may be patterned in a stepped manner. Accordingly, the portion of the first pre-mold pMS1 on the second area R2 may be stacked in a stepwise fashion.

The interlayer insulating film 140 covering the first pre-mold pMS1 may be formed on (e.g., formed directly thereon) the first face 100_1 of the plate layer 100. In an embodiment, a first pre-channel structure extending through a portion of each of the first pre-mold pMS1 and the interlayer insulating film 140 on the first area R1, a first pre-cell contact structure, a first pre-dummy channel structure, and a first pre-source contact structure extending through a portion of each of the first pre-mold pMS1 and the interlayer insulating film 140 on the second area R2, and a first pre-input/output contact structure extending through a portion of each of the first pre-mold pMS1 and the interlayer insulating film 140 on the third area R3 may be formed.

In an embodiment, each of the first pre-cell contact structure, the first pre-dummy channel structure, the first pre-source contact structure, and the first pre-input/output contact structure may extend through a portion of the plate layer 100 (e.g., in the third direction Z).

In an embodiment, each of the first pre-channel structure, the first pre-cell contact structure, the first pre-dummy channel structure, the first pre-source contact structure and the first pre-input/output contact structure may include a material having an etching selectivity with respect to a material of each of the first mold sacrificial film 112 and the first mold insulating film 110. For example, each of the first pre-channel structure, the first pre-cell contact structure, the first pre-dummy channel structure, the first pre-source contact structure and the first pre-input/output contact structure may include polysilicon.

A second pre-mold pMS2 may be formed on the first pre-mold pMS1. The second pre-mold pMS2 may include a plurality of second mold insulating films 110 and a plurality of second mold sacrificial films 114 alternately stacked on top of each other while being disposed on the first pre-mold pMS1. Since a method of forming the second pre-mold pMS2 may be similar to a method of forming the first pre-mold pMS1, detailed description of the former will be omitted below for economy of description.

The interlayer insulating film 140 may be embodied as a stack of a plurality of layers covering each of the first pre-mold pMS1 and the second pre-mold pMS2. In an embodiment, a boundary face may not be formed between adjacent ones of the plurality of layers.

A second pre-channel structure extending through (e.g., in the third direction Z) a portion of each of the second pre-mold pMS2 and the interlayer insulating film 140 on the first area R1, a second pre-cell contact structure, a second pre-dummy channel structure and a second pre-source contact structure extending through (e.g., in the third direction Z) a portion of each of the second pre-mold pMS2 and the interlayer insulating film 140 on the second area R2, and a second pre-input/output contact structure extending through (e.g., in the third direction Z) a portion of each of the second pre-mold pMS2 and the interlayer insulating film 140 on the third area R3 may be formed. Accordingly, a pre-channel structure, a pre-cell contact structure, a pre-dummy channel structure, a pre-source contact structure, and a pre-input/output contact structure may be formed. A scheme of forming each of the second pre-channel structure, the second pre-cell contact structure, the second pre-dummy channel structure, the second pre-source contact structure, and the second pre-input/output contact structure may be similar to a scheme of forming each of the first pre-channel structure, the first pre-cell contact structure, the first pre-dummy channel structure, the first pre-source contact structure, and the first pre-input/output contact structure. Thus, a detailed description of the former may be omitted below for economy of description.

Thereafter, as shown in FIG. 21 the channel structure CH, the cell contact structure CMC, the dummy channel structure DCH, the source contact structure PCC, and the input/output contact structure IMC may be formed.

For example, the pre-channel structure, the pre-cell contact structure, the pre-dummy channel structure, the pre-source contact structure, and the pre-input/output contact structure may be selectively removed. The channel structure CH, the cell contact structure CMC, the dummy channel structure DCH, the source contact structure PCC, and the input/output contact structure IMC may be formed so as to respectively fill spaces respectively obtained via the removal of the pre-channel structure, the pre-cell contact structure, the pre-dummy channel structure, the pre-source contact structure, and the pre-input/output contact structure.

Figure 24:
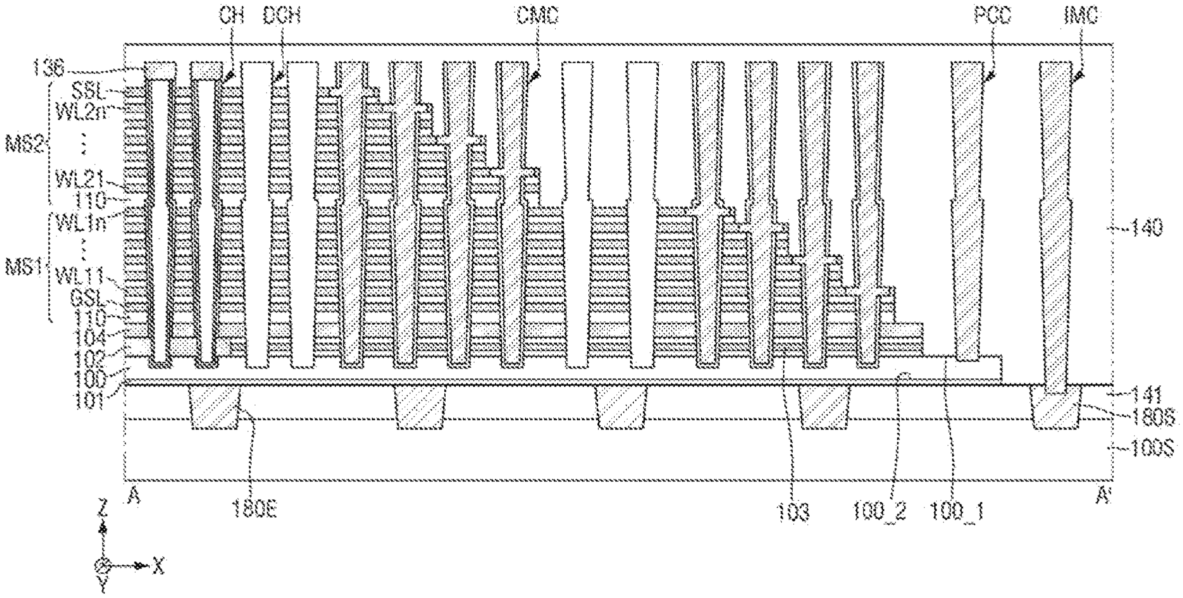
Figure 25:
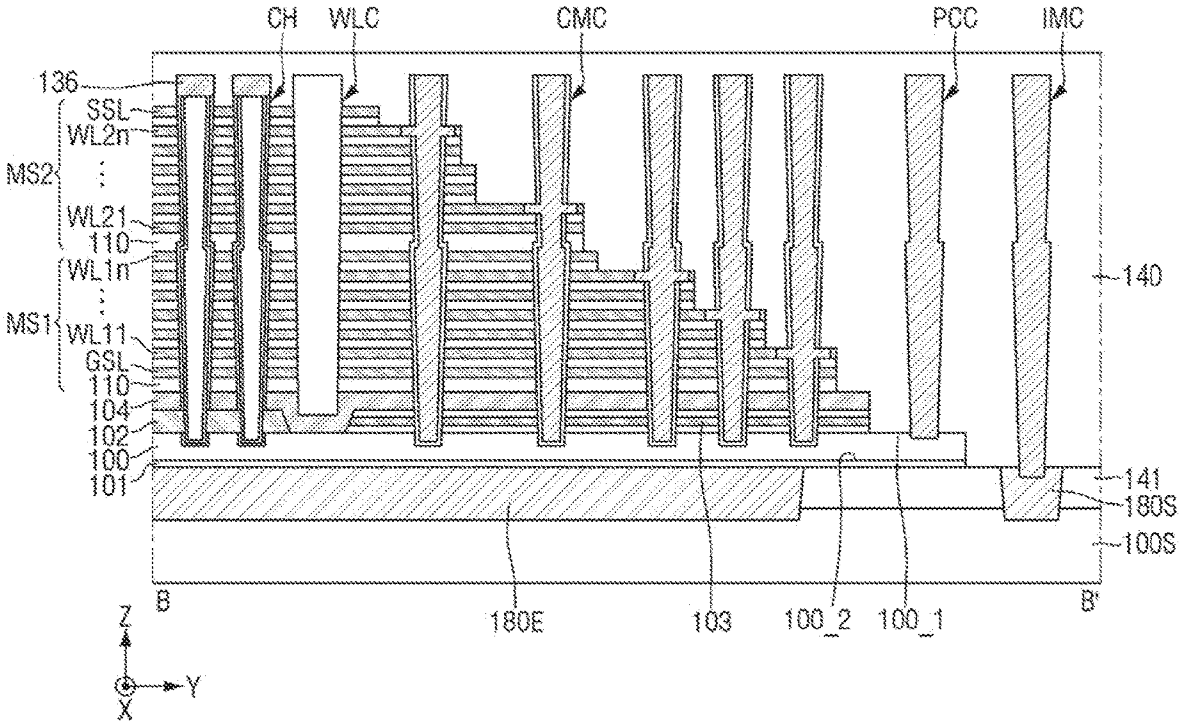

Referring to FIG. 24 and FIG. 25, the word-line cutting structure WLC may be formed. The word-line cutting structure WLC may extend in the first direction X so as to cut the first and second pre-molds pMS1 and pMS2. In an embodiment, a top face of the word-line cutting structure WLC in a direction from the first face 100_1 of the plate layer 100 towards the second face 100_2 thereof may be closer to the second face 100_2 of the plate layer 100 than the top face of the channel structure CH in a direction from the first face 100_1 of the plate layer 100 towards the second face 100_2 thereof. In an embodiment, the top face of the word-line cutting structure WLC may be substantially coplanar (e.g., in the third direction Z) with at least one of a top face of the cell contact structure CMC, a top face of the dummy channel structure DCH, a top face of the source contact structure PCC, and a top face of the input/output contact structure IMC. However, embodiments of the present disclosure are not necessarily limited thereto.

Thereafter, a portion of the nitride layer 103 in the first area R1 may be replaced with the source layer 102 including polysilicon. However, a portion of the nitride layer 103 in each of the second area R2 and the third area R3 may remain.

Thereafter, the plurality of gate electrodes GSL, WL11 to WL1*n*, and WL21 to WL2*n*, and SSL may be formed. For example, the first and second mold sacrificial films 112 and 114 exposed through the word-line cutting structure WLC may be selectively removed. Subsequently, the gate electrodes GSL, WL11 to WL1*n*, and WL21 to WL2*n*, and SSL may be formed so as to respectively fill spaces respectively obtained via the removal of the first and second mold sacrificial films 112 and 114. Based on these steps, the first mold structure MS1 including the plurality of first gate electrodes GSL, and WL11 to WL1*n* and the second mold structure MS2 including the plurality of second gate electrodes WL21 to WL2*n*, and SSL may be formed. After the first mold structure MS1 and the second mold structure MS2 have been formed, the word-line cutting structure WLC may be filled with an insulating material.

Figure 26:
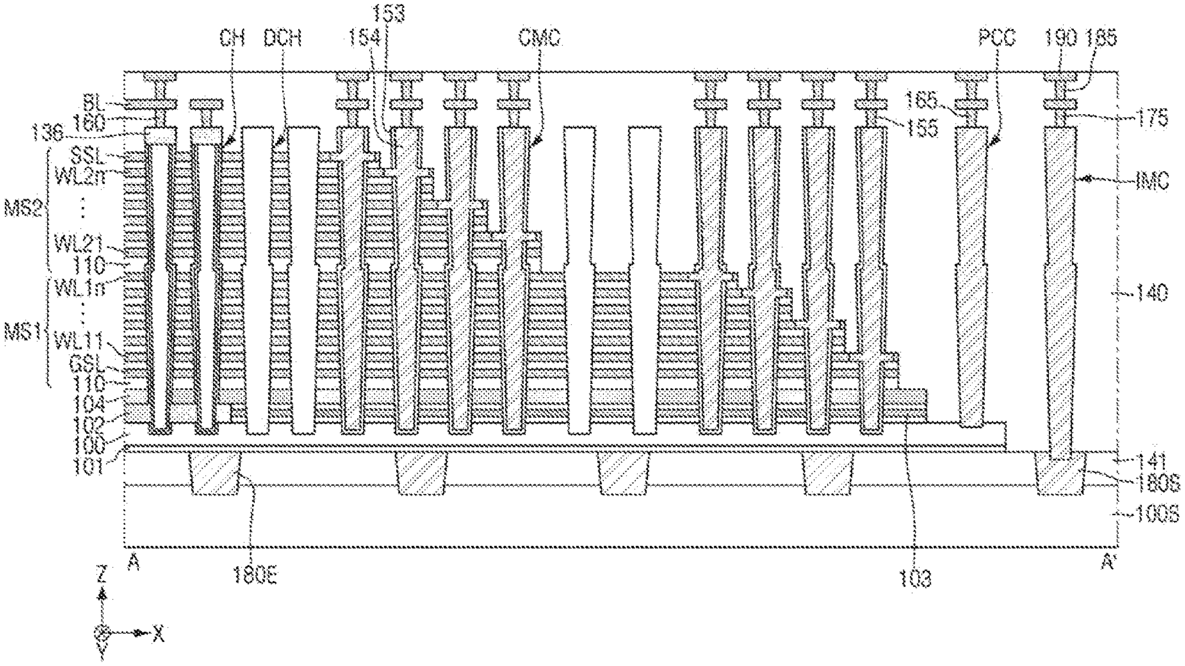
Figure 27:
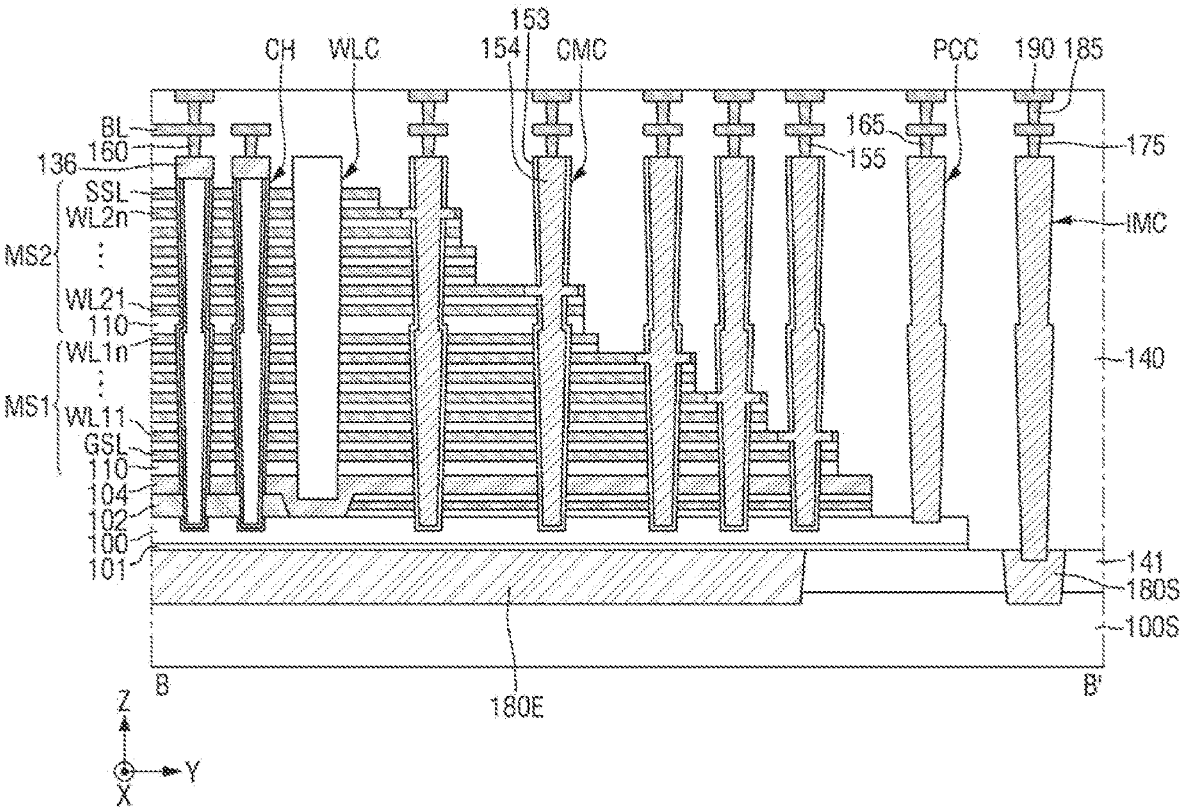

Referring to FIG. 26 and FIG. 27, the bit-line contact 160 may be formed on the channel pad 136. The first contact 155 may be formed on the cell contact structure CMC. The second contact 165 may be formed on the source contact structure PCC. The third contact 175 may be formed on the input/output contact structure IMC. The bit-line BL may be electrically connected to the channel pad 136 via the bit-line contact 160, may be electrically connected to the cell contact structure CMC via the first contact 155, may be electrically connected to the source contact structure PCC via the second contact 165, and may be electrically connected to the input/output contact structure IMC via the third contact 175.

The first bonding contact 185 and the first bonding metal layer 190 may be formed. The first bonding metal layer 190 may be electrically connected to the bit-line BL via the first bonding contact 185.

Figure 28:
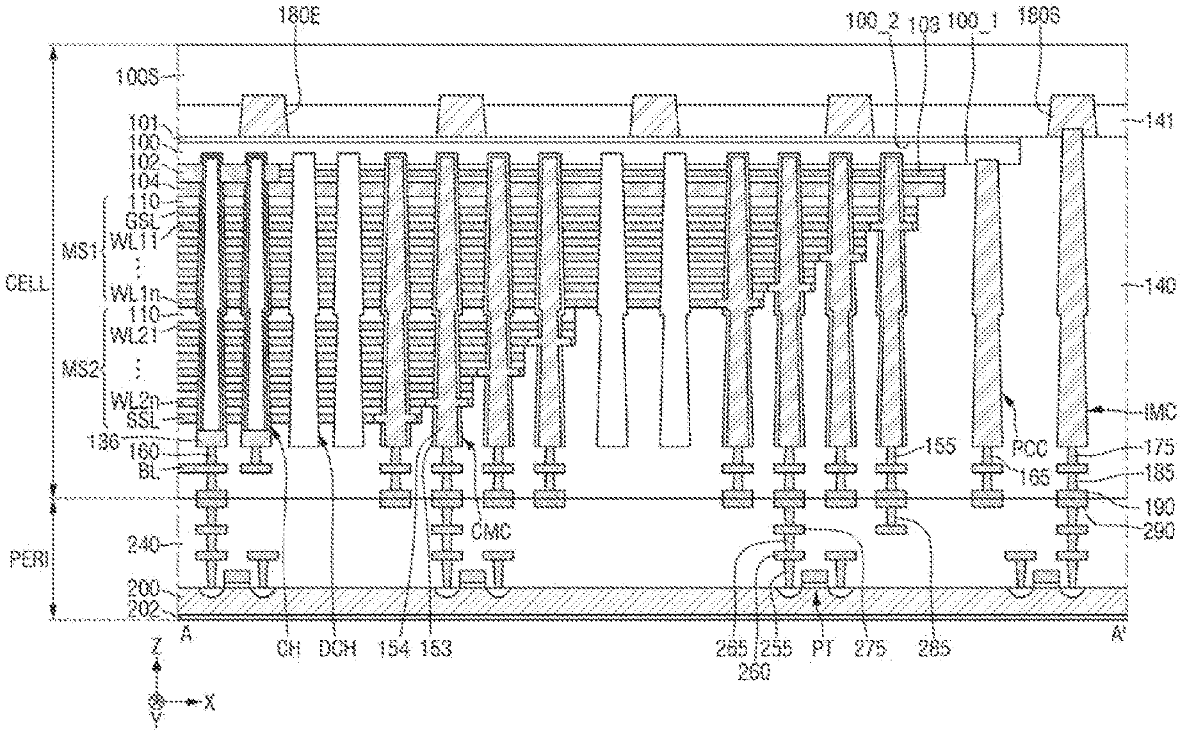
Figure 29:
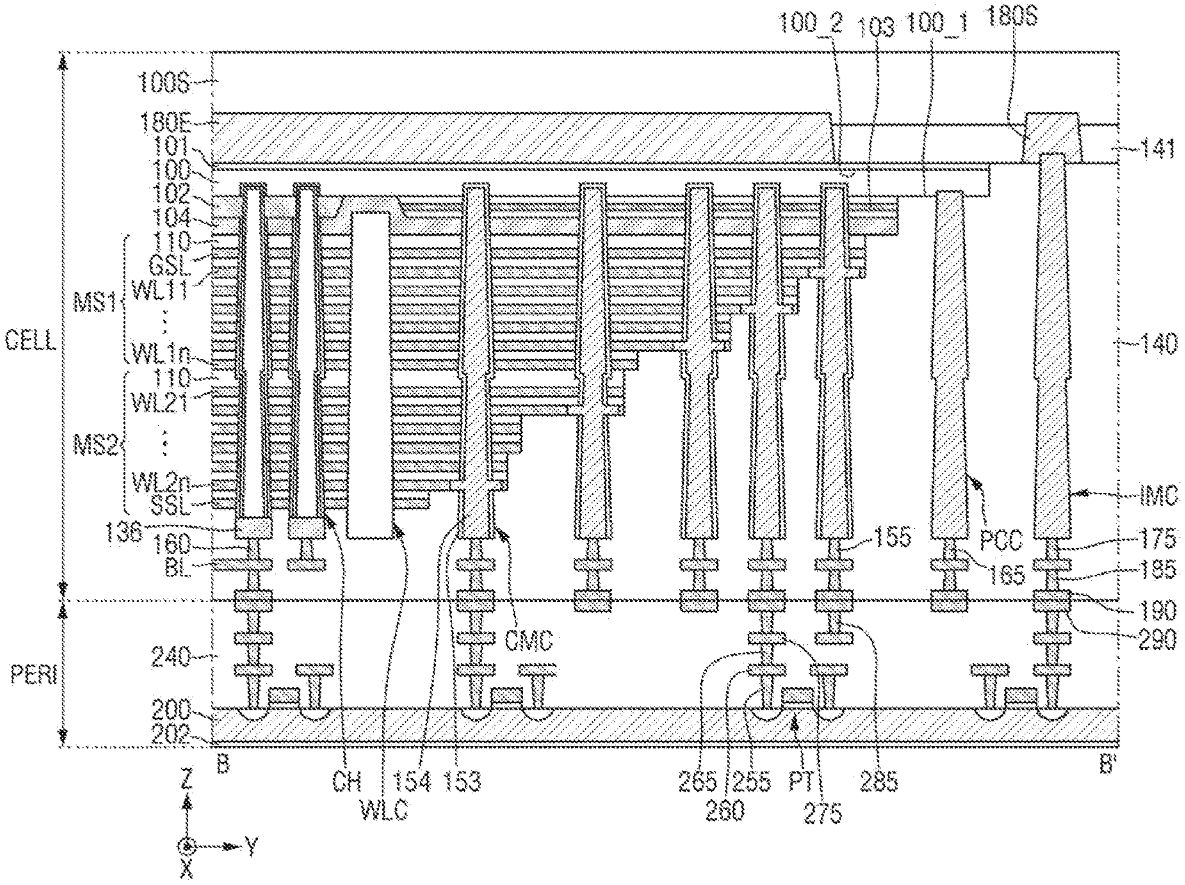

Referring to FIG. 28 and FIG. 29, the peripheral circuit structure PERI and the cell structure CELL may be bonded to each other. The peripheral circuit structure PERI and the cell structure CELL may be stacked (e.g., in the third direction Z) such that the first face 100_1 of the plate layer 100 and the front face of the peripheral circuit substrate 200 may face each other. The first bonding metal layer 190 and the second bonding metal layer 290 may be bonded to each other. Accordingly, the cell structure CELL may be stacked on the peripheral circuit structure PERI.

Thereafter, the cell substrate 100S may be removed, and a planarization process such as CMP may be performed on the top face of the via structures 180. Subsequently, the second insulating layer 142 may be formed on the planarized top face of the via structures 180 as shown in FIGS. 7 and 8. For example, in an embodiment the second insulating layer 142 may include the same insulating material as that of the first insulating layer 141. However, embodiments of the present disclosure are not necessarily limited thereto.

In an embodiment, via connecting structure holes spaced apart from each other may be formed in the second insulating layer 142. In a plan view, the via connecting structure hole may extend in a direction intersecting a direction in which the via structures 180 extend. The via connecting structure hole may be formed by etching at least a portion of the second insulating layer 142 using a mask formed on the second insulating layer 142.

As shown in FIG. 7 and FIG. 8, the via connecting structure 195 may be formed inside the via connecting structure hole. The via structures 180 and the via connecting structures 195 formed in the third area R3 may be electrically connected to the input/output contact structure IMC. The via connecting structures 195 may be disposed on the top face of the via structures 180 to be connected to the via structures 180. For example, in an embodiment each of the via connecting structures 195 may include aluminum (Al). The via connecting structures 195 formed in the third area R3 may act as input/output pads connected to the input/output contact structure IMC.

According to some embodiments, the forming of the via connecting structures 195 connecting the via structures 180 to each other after the wafer bonding may allow an electrical resistance of the plate layer 100 to be reduced.

Further, according to some embodiments, after forming the via structures 180, the wafer bonding process of stacking the cell structure CELL on the peripheral circuit structure PERI so that the first face 100_1 of the plate layer 100 and the front face of the peripheral circuit substrate 200 face each other may be performed. As a result, a shape of each of the via structures 180 and a shape of each of the via connecting structures 195 may be different from each other.

In an embodiment, in each of the first and second directions X and Y, the width W1 of the bottom face of each of the via structures 180 facing the second face 100_2 of the plate layer 100 may be greater than or equal to the width W2 of the top face of each of the via structures 180. For example, the width of each of the via structures 180 may increase as each of the via structures 180 extends towards the plate layer 100 along the third direction Z.

Further, in each of the first and second directions X and Y, the width W3 of the bottom face of each of the via connecting structures 195 facing the top face of each of the via structures 180 may be less than or equal to the width W4 of the top face of each of the via connecting structures 195. For example, the width of each of the via connecting structures 195 may decrease as each of the via connecting structures 195 extends towards the plate layer 100 along the third direction Z.

Figure 30:
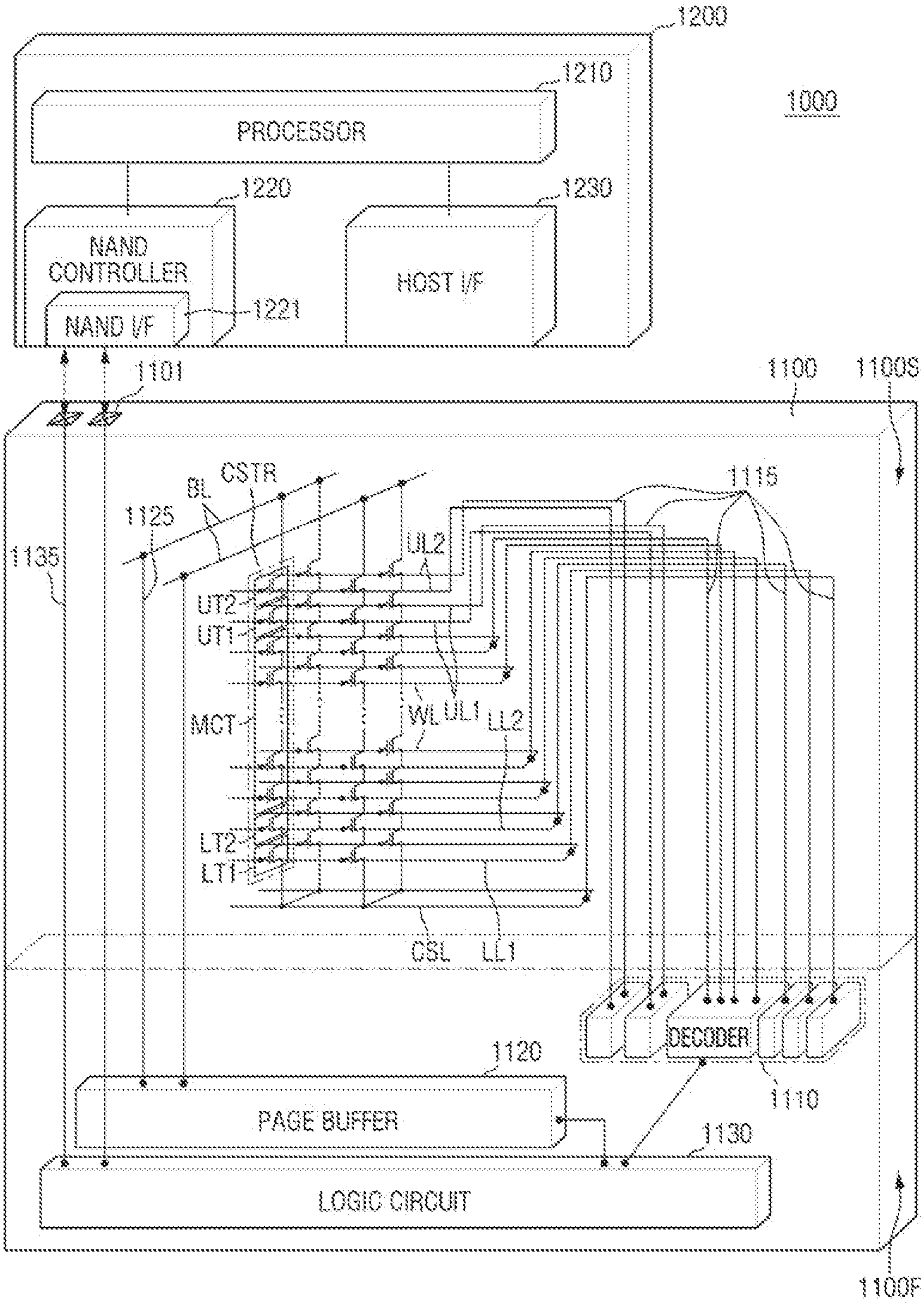
FIG. 30 is an illustrative block diagram for illustrating an electronic system according to some embodiments.
Figure 31:
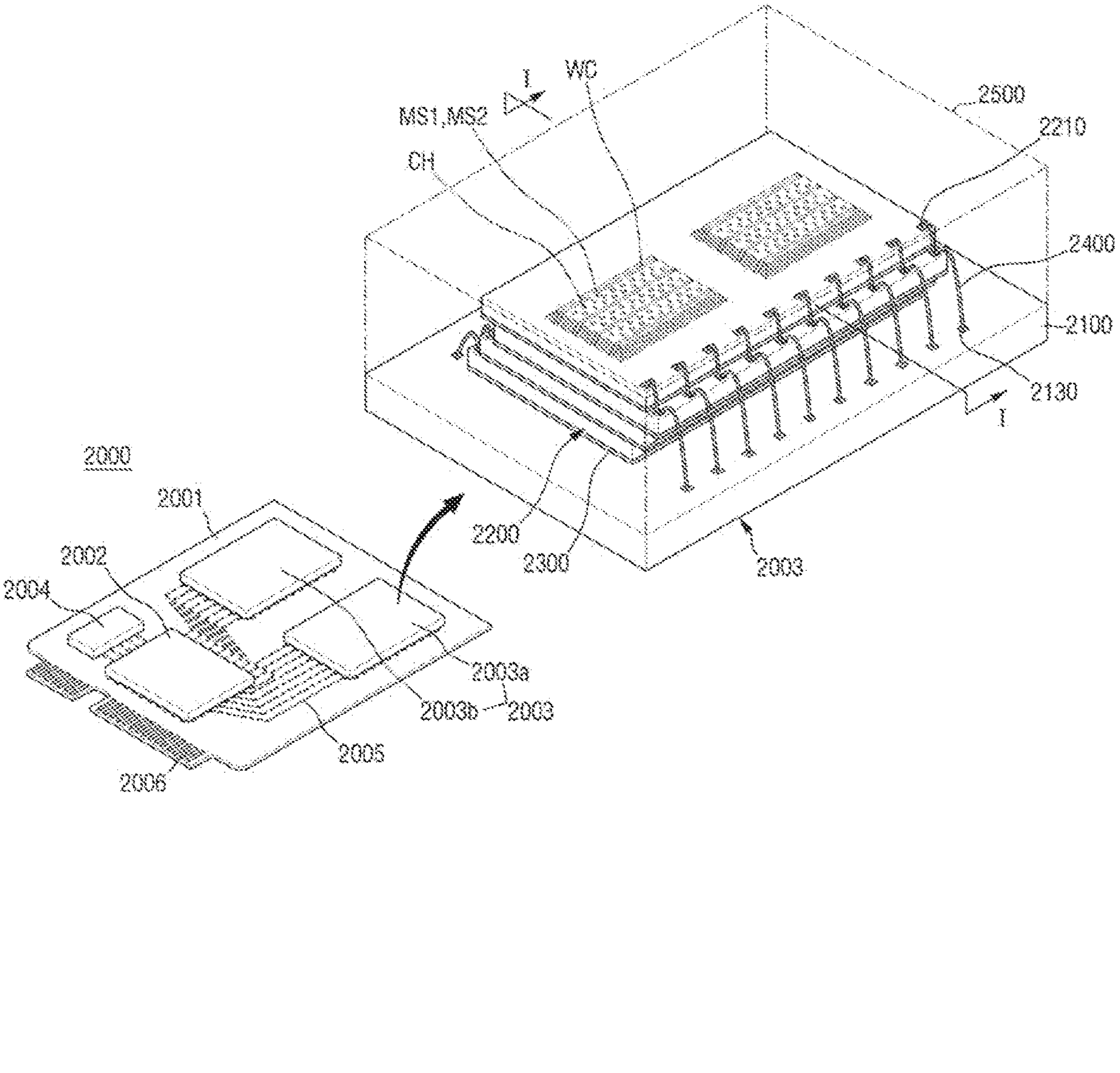
FIG. 31 is an illustrative perspective view for illustrating an electronic system according to some embodiments.
Figure 32:
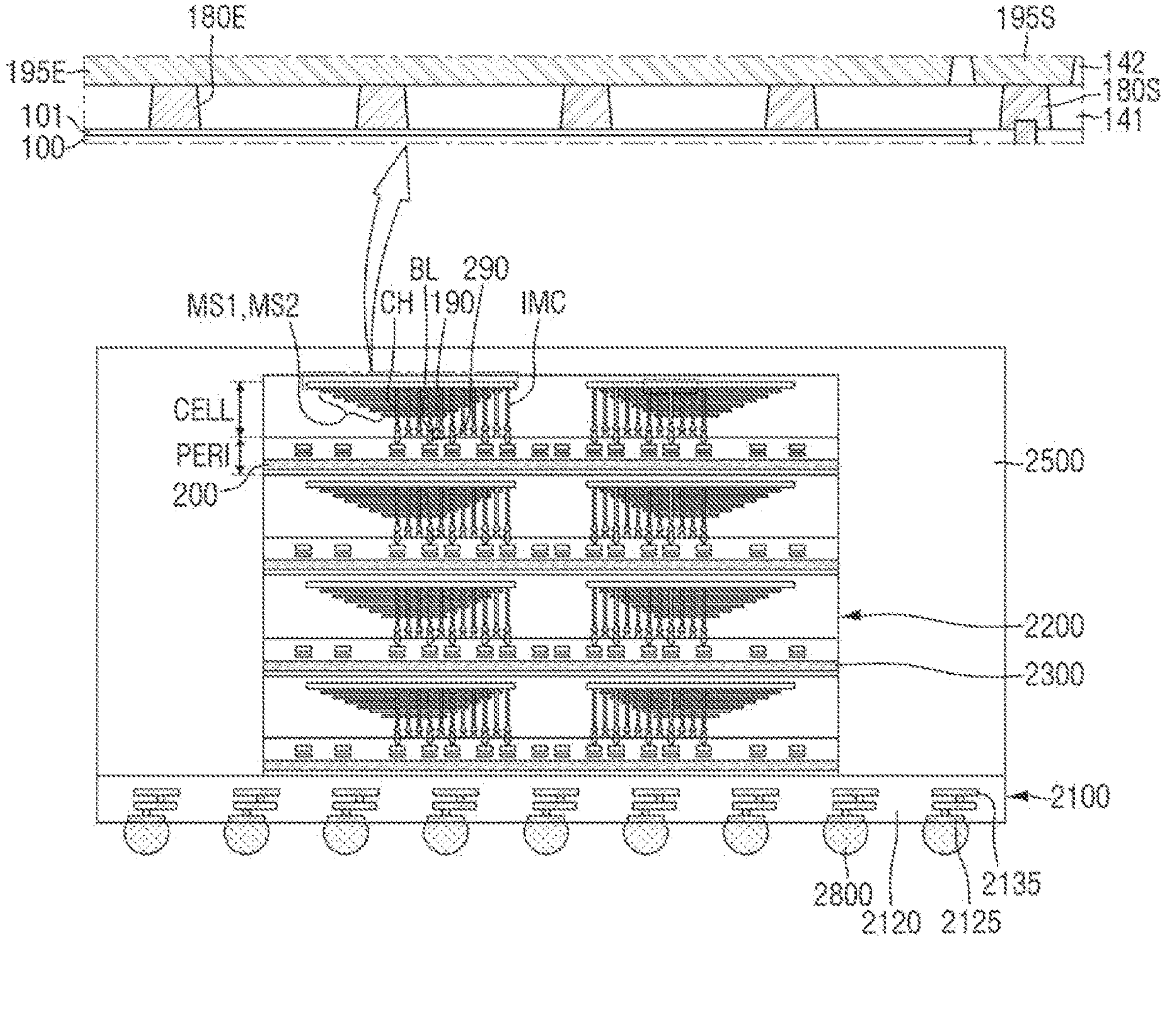
FIG. 32 is a schematic cross-sectional view taken along I-I of FIG. 31 according to some embodiments.

FIG. 30 is an illustrative block diagram for illustrating an electronic system according to some embodiments. FIG. 31 is an illustrative perspective view for illustrating an electronic system according to some embodiments. FIG. 32 is a schematic cross-sectional view taken along I-I of FIG. 31 according to some embodiments. For convenience of description, following descriptions are based on differences thereof from those as set forth with reference to FIGS. 1 to 12 and a repeated description of similar or identical features may be omitted for economy of description.

Referring to FIG. 30, an electronic system 1000 according to some embodiments may include a semiconductor device 1100 and a controller 1200 electrically connected to the semiconductor device 1100. The electronic system 1000 may be a storage device including one or a plurality of semiconductor devices 1100 or an electronic device including the storage device. For example, in an embodiment the electronic system 1000 may be embodied as a solid state drive device (SSD), a Universal Serial Bus (USB), a computing system, a medical device, or a communication device including one or a plurality of semiconductor memory devices 1100.

In an embodiment, the semiconductor device 1100 may be embodied as a semiconductor memory device (e.g., a NAND flash memory device). The semiconductor device 1100 may be embodied, as for example, the semiconductor device as described above with reference to FIGS. 1 to 12. The semiconductor device 1100 may include a first structure 1100F and a second structure 1100S on the first structure 1100F.

The first structure 1100F may be a peripheral circuit structure including a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1). In an embodiment, the first structure 1100F may be embodied as, for example, the peripheral circuit structure PERI as described above with reference to FIGS. 1 to 12.

The second structure 1100S may include the common source line CSL, the plurality of bit-lines BL and the plurality of cell strings CSTR as above-described with reference to FIG. 3. The cell strings CSTR may be connected to the decoder circuit 1110 via the word-line WL, at least one string select line SSL, and at least one ground select line GSL. Further, the cell strings CSTR may be connected to the page buffer 1120 via the bit-lines BL. In an embodiment, the second structure 1100S may be embodied as, for example, the cell structure CELL as described above using FIGS. 1 to 12.

In some embodiments, the common source line CSL and the cell string CSTR may be electrically connected to the decoder circuit 1110 via a first connection wiring 1115 extending from the first structure 1100F to the second structure 1100S. In an embodiment, the first connection wiring 1115 may be embodied as, for example, the cell contact structure CMC as described above using FIGS. 1 to 12. For example, the cell contact structure CMC may electrically connect the gate electrodes GSL, WL, and SSL to the decoder circuit 1110 (e.g., the row decoder 33 of FIG. 1).

In some embodiments, the bit-lines BL may be electrically connected to the page buffer 1120 via a second connection wiring 1125. The second connection wiring 1125 may be embodied as, for example, the bit-line contact 160 as described above with reference to FIGS. 1 to 13. For example, the bit-line contact 160 may electrically connect the bit-lines BL to the page buffer 1120 (e.g., the page buffer 35 in FIG. 1).

The semiconductor device 1100 may communicate with the controller 1200 via an input/output pad 1101 electrically connected to the logic circuit 1130 (e.g., the control logic 37 in FIG. 1). The input/output pad 1101 may be electrically connected to the logic circuit 1130 via an input/output connection line 1135 extending from the first structure 1100F to the second structure 1100S. In an embodiment, the connection line 1135 may be embodied as, for example, the input/output contact structure IMC using FIGS. 1 to 12.

The controller 1200 may include a processor 1210, a NAND controller 1220, and a host interface 1230. In some embodiments, the electronic system 1000 may include a plurality of semiconductor memory devices 1100. In an embodiment, the controller 1200 may control the plurality of semiconductor memory devices 1100.

The processor 1210 may control overall operations of the electronic system 1000 including the controller 1200. The processor 1210 may operate based on predefined firmware, and may control the NAND controller 1220 to access the semiconductor device 1100. The NAND controller 1220 may include a NAND interface 1221 that processes communication with the semiconductor device 1100. A control command for controlling the semiconductor device 1100, data to be written to memory cell transistors MCT of the semiconductor device 1100, and data to be read from the memory cell transistors MCT of the semiconductor device 1100 may be transmitted via the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Referring to FIG. 31 and FIG. 32, an electronic system according to some embodiments may include a main substrate 2001, a main controller 2002 mounted on the main substrate 2001, at least one semiconductor package 2003, and at least one DRAM 2004. The semiconductor package 2003 and the DRAM 2004 may be connected to the main controller 2002 via line patterns 2005 formed on the main substrate 2001.

The main substrate 2001 may include a connector 2006 including a plurality of pins coupled to an external host. In an embodiment of the present disclosure, the number and an arrangement of the plurality of pins in the connector 2006 may vary, such as based on a communication interface between the electronic system 2000 and the external host. In some embodiments, the electronic system 2000 may communicate with the external host using one of interfaces such as USB (Universal Serial Bus), PCI-Express (Peripheral Component Interconnect Express), SATA (Serial Advanced Technology Attachment), M-Phy for UFS (Universal Flash Storage), etc. In some embodiments, the electronic system 2000 may operate using power supplied from the external host via the connector 2006. The electronic system 2000 may further include a power management integrated circuit (PMIC) for distributing power supplied from the external host to the main controller 2002 and the semiconductor package 2003.

The main controller 2002 may write data to the semiconductor package 2003 or read data from the semiconductor package 2003, and may increase an operating speed of the electronic system 2000.

The DRAM 2004 may act as a buffer memory for reducing a difference between operation speeds of the semiconductor package 2003 as a data storage space and the external host. The DRAM 2004 included in electronic system 2000 may operate as a cache memory, and may provide a space for temporarily storing data therein in a control operation of the semiconductor package 2003. In an embodiment in which the DRAM 2004 is included in the electronic system 2000, the main controller 2002 may further include a DRAM controller for controlling the DRAM 2004 in addition to a NAND controller for controlling the semiconductor package 2003.

The semiconductor package 2003 may include a first semiconductor package 2003*a* and a second semiconductor package 2003*b* spaced apart from each other. Each of the first semiconductor package 2003*a* and the second semiconductor package 2003*b* may be embodied as a semiconductor package including a plurality of semiconductor chips 2200. Each of the first semiconductor package 2003*a* and the second semiconductor package 2003*b* may include a package substrate 2100, semiconductor chips 2200 on the package substrate 2100, adhesive layers 2300 disposed on a bottom face of each of the semiconductor chips 2200, a connection structure 2400 electrically connecting the semiconductor chips 2200 and the package substrate 2100 to each other, and a molding layer 2500 disposed the package substrate 2100 and covering the semiconductor chips 2200 and the connection structure 2400.

In an embodiment, the package substrate 2100 may be embodied as a printed circuit board including package upper pads 2130. Each semiconductor chip 2200 may include an input/output pad 2210. In an embodiment, the input/output pad 2210 may be embodied as the input/output pad 1101 in FIG. 30.

In some embodiments, the connection structure 2400 may be embodied as a bonding wire that electrically connects the input/output pad 2210 and the package upper pads 2130 to each other. Accordingly, in each of the first semiconductor package 2003*a* and the second semiconductor package 2003*b*, the semiconductor chips 2200 may be electrically connected to each other in a bonding wire scheme, and may be electrically connected to the package upper pads 2130 of the package substrate 2100. However, embodiments of the present disclosure are not necessarily limited thereto. For example, in some embodiments, in each of the first semiconductor package 2003*a* and the second semiconductor package 2003*b*, the semiconductor chips 2200 may be electrically connected to each other via a connection structure including a through electrode (Through Silicon Via: TSV) instead of the connection structure 2400 using the bonding wire scheme.

In some embodiments, the main controller 2002 and the semiconductor chips 2200 may be included in one package. In some embodiments, the main controller 2002 and the semiconductor chips 2200 may be mounted on a separate interposer substrate different from the main substrate 2001, and the main controller 2002 and the semiconductor chips 2200 may be connected to each other via a line formed in the interposer substrate.

In some embodiments, the package substrate 2100 may be embodied as a printed circuit board. The package substrate 2100 may include a package substrate body 2120, the package upper pads (2130 in FIG. 21) disposed on a top face of the package substrate body 2120, package lower pads 2125 disposed on a bottom face of the package substrate body 2120, or exposed through the bottom face thereof, and internal lines 2135 disposed in the package substrate body 2120 so as to electrically connect the upper pads 2130 and the lower pads 2125 to each other. The upper pads 2130 may be electrically connected to the connection structures 2400. The lower pads 2125 may be connected to the line patterns 2005 of the main substrate 2010 of the electronic system 2000 via conductive connectors 2800 as shown in FIG. 31.

In the electronic system according to some embodiments, each of the semiconductor chips 2200 may include the semiconductor device as described above with reference to FIGS. 1 to 12. For example, in an embodiment each of the semiconductor chips 2200 may include the peripheral circuit structure PERI and the cell structure CELL stacked on the peripheral circuit structure PERI (e.g., in the third direction Z), as described above with reference to FIGS. 1 to 12. In an embodiment, the cell structure CELL may include the plate layer 100, the via structures 180, the via connecting structures 195, the gate electrode layers GSL, WL11 to WL1*n*, WL21 to WL2*n*, and SSL, the channel structures CH, the word-line cutting structures WLC, the dummy channel structures DCH, the cell contact structures CMC, the source contact structures PCC, the input/output contact structures IMC, the first insulating layer 141, and the first bonding metal layer 190 as described above with reference to FIGS. 1 to 12. The peripheral circuit structure PERI and the cell structure CELL may be bonded to each other via the first bonding metal layer 190 and the second bonding metal layer 290.

Although embodiments of the present disclosure have been described with reference to the accompanying drawings, the present disclosure is not limited to the above embodiments, but may be implemented in various different forms. A person skilled in the art may appreciate that embodiments of the present disclosure may be practiced in other concrete forms without changing the technical spirit or essential characteristics of the present disclosure. Therefore, it should be appreciated that embodiments of the present disclosure as described above is not restrictive but illustrative in all respects.

What is claimed is:

1. A semiconductor device comprising:

a first substrate structure including a first substrate, circuit elements at least partially disposed on or in the first substrate, and first bonding metal layers disposed on the circuit elements; and a second substrate structure disposed on the first substrate structure, wherein the second substrate structure is connected to the first substrate structure, wherein the second substrate structure includes:

a plate layer including a conductive material, the plate layer having first and second faces opposite to each other;

gate electrode layers disposed on the first face of the plate layer, the gate electrode layers are stacked on top of each other in a first direction perpendicular to the first face of the plate layer and are spaced apart from each other in the first direction;

channel structures extending through the gate electrode layers in the first direction;

word-line cutting structures extending through the gate electrode layers, the word-line cutting structures extend in each of the first direction and a second direction intersecting the first direction wherein the word-line cutting structures are spaced apart from each other along a third direction intersecting each of the first and second directions and parallel to the first face of the plate layer, via structures disposed on the second face of the plate layer, the via structures extending in the third direction, wherein the via structures are spaced apart from each other along the second direction, each of the via structures includes a bottom face facing the second face of the plate layer and a top face opposite the bottom face;

via connecting structures disposed on the top face of the via structures, the via connecting structures extending in the second direction, wherein the via connecting structures are spaced apart from each other along the third direction, each of the via connecting structures includes a bottom face facing the top face of the via structures and a top face opposite the bottom face; and second bonding metal layers disposed under the channel structures and the gate electrode layers and connected to the first bonding metal layers, wherein a width of the bottom face of each of the via structures is greater than a width of the top face of each of the via structures, wherein a width of the bottom face of each of the via connecting structures is less than a width of the top face of each of the via connecting structures, wherein in a plan view of the semiconductor device, the second substrate structure includes a first area including the channel structures, and second and third areas sequentially arranged outwardly from the first area, wherein the second substrate structure includes:

cell contact structures disposed in the second area, each of the cell contact structures are electrically connected to one of the gate electrode layers;

dummy channel structures disposed in the second area, the dummy channel structures are electrically isolated from the gate electrode layers;

source contact structures disposed in the second area, the source contact structures do not extend through the gate electrode layers and extending through at least a portion of the plate layer; and through structures disposed in the third area, the through structures are not disposed on the plate layer, wherein the through structures are electrically connected to the circuit elements, wherein each of the via structures includes:

a first extension disposed in the first and second areas and extending in the third direction; and a first spaced portion disposed in the third area and spaced apart from the first extension, wherein the first spaced portion is connected to one of the through structures.

2. The semiconductor device of claim 1, wherein the semiconductor device further comprises an insulating layer disposed on the second face of the plate layer and directly contacting a side face of each of the via structures.

3. The semiconductor device of claim 1, wherein each of the via structures does not contact a side face of the plate layer.

4. The semiconductor device of claim 1, wherein a length along the second direction of each of the via structures is different from a length along the second direction of each of the via connecting structures, respectively.

5. The semiconductor device of claim 1, wherein:

the plate layer includes polysilicon;

each of the via structures includes tungsten (W), each of the via connecting structures includes aluminum (Al).

6. The semiconductor device of claim 1, wherein the first extension includes a plurality of extensions spaced apart from each other in the third direction.

7. The semiconductor device of claim 1, wherein each of the via connecting structures includes:

a second extension disposed in the first and second areas and extending in the second direction, and a second spaced portion disposed in the third area and spaced apart from the second extension, wherein the second spaced portion is connected to one of the through structures.

8. The semiconductor device of claim 7, wherein the second extension includes a plurality of extensions, wherein the plurality of extensions and the word-line cutting structures are arranged alternately with each other in the third direction.

9. The semiconductor device of claim 7, wherein the second extension has a plate shape and is disposed on the word-line cutting structures.

10. A semiconductor device comprising:

a first substrate structure including a first substrate, circuit elements at least partially disposed on or in the first substrate, and first bonding metal layers disposed on the circuit elements; and a second substrate structure disposed on the first substrate structure, wherein the second substrate structure is connected to the first substrate structure, wherein the second substrate structure includes:

a plate layer including a conductive material;

gate electrode layers disposed on a bottom face of the plate layer, the gate electrode layers are stacked on top of each other and spaced apart from each other along a vertical direction perpendicular to the bottom face of the plate layer;

channel structures extending through the gate electrode layers in the vertical direction, wherein each of the channel structures includes a channel layer;

word-line cutting structures extending through the gate electrode layers and extending in a first direction parallel to the bottom face of the plate layer;

via structures disposed on the plate layer and extending in a second direction intersecting the first direction, wherein the via structures are spaced apart from each other along the first direction;

via connecting structures disposed on a top surface of the via structures, the via connecting structures extending in the first direction, wherein the via connecting structures are spaced apart from each other along the second direction; and second bonding metal layers disposed under the channel structures and the gate electrode layers and connected to the first bonding metal layers, wherein in a plan view of the semiconductor device, the second substrate structure includes a first area including the channel structures, and a second area around the first area, wherein each of the via structures includes:

a first extension disposed in the first area and extending in the second direction; and a first spaced portion disposed in the second area and spaced apart from the first extension in each of the first and second directions, wherein each of the via connecting structures includes:

a second extension disposed in the first area and extending in the first direction; and a second spaced portion disposed in the second area and spaced apart from the second extension in each of the first and second directions.

11. The semiconductor device of claim 10, wherein:

through structures are disposed in the second area, the through structures are not disposed on the plate layer, wherein the through structures are electrically connected to the circuit elements; and each of the first and second spaced portions is connected to one of the through structures.

12. The semiconductor device of claim 10, wherein a length along the first direction of the first extension is different from a length along the first direction of the second extension.

13. The semiconductor device of claim 10, wherein a width of each of the via structures increases as each of the via structures extends towards the plate layer, wherein a width of each of the via connecting structures decreases as each of the via connecting structures extends towards the plate layer.

14. The semiconductor device of claim 10, wherein the semiconductor device further comprises a source layer disposed on the plate layer, and a source support layer disposed on the source layer, wherein the word-line cutting structures disposed in the first area extend through the source layer, wherein the word-line cutting structures disposed in the second area do not extend through the source layer.

15. The semiconductor device of claim 10, wherein each of the via structures does not extend through the plate layer.

16. The semiconductor device of claim 10, wherein:

each of the via structures includes a same material as a material of each of the gate electrode layers, wherein each of the via connecting structures includes aluminum (Al).

* * * * *